United States Patent
Cheng et al.

(10) Patent No.: US 12,477,848 B2
(45) Date of Patent: Nov. 18, 2025

(54) CHIP PACKAGE AND METHOD FOR FORMING THE SAME

(71) Applicant: XINTEC INC., Taoyuan (TW)

(72) Inventors: Chia-Ming Cheng, New Taipei (TW); Shu-Ming Chang, New Taipei (TW)

(73) Assignee: XINTEC INC., Taoyuan (TW)

( * ) Notice: Subject to any disclaimer, the term of this patent is extended or adjusted under 35 U.S.C. 154(b) by 467 days.

(21) Appl. No.: 18/077,152

(22) Filed: Dec. 7, 2022

(65) Prior Publication Data

US 2023/0238408 A1 Jul. 27, 2023

Related U.S. Application Data

(60) Provisional application No. 63/303,429, filed on Jan. 26, 2022.

(51) Int. Cl.
*H10F 39/00* (2025.01)
*H01L 23/00* (2006.01)

(52) U.S. Cl.
CPC ......... *H10F 39/804* (2025.01); *H10F 39/809* (2025.01); *H10F 39/811* (2025.01); *H01L 24/16* (2013.01); *H01L 2224/16225* (2013.01)

(58) Field of Classification Search
None
See application file for complete search history.

(56) References Cited

U.S. PATENT DOCUMENTS

| | | | | |
|---|---|---|---|---|
| 2008/0099903 | A1* | 5/2008 | Shen | H01L 23/5389 257/E23.18 |
| 2008/0246126 | A1* | 10/2008 | Bowles | H01L 25/50 257/659 |
| 2009/0152658 | A1* | 6/2009 | Bolken | H10F 39/806 257/E31.127 |
| 2015/0255500 | A1* | 9/2015 | Akahoshi | H10F 39/018 257/434 |

(Continued)

FOREIGN PATENT DOCUMENTS

| TW | 200915525 A | 4/2009 |
|---|---|---|
| TW | 201501265 | 1/2015 |
| TW | 201703220 | 1/2017 |

OTHER PUBLICATIONS

The office action dated Jan. 24, 2024 issued in the counterpart TW patent application 112102488, including search report.

(Continued)

*Primary Examiner* — Cory W Eskridge
(74) *Attorney, Agent, or Firm* — LIU & LIU

(57) ABSTRACT

A chip package is provided. The chip package includes a first semiconductor chip, a second semiconductor chip, a first encapsulating layer, a second encapsulating layer, a first through-via, and a second through-via. The second semiconductor chip is stacked on the first semiconductor chip, and the first encapsulating layer and the second encapsulating layer surround the first semiconductor chip and the second semiconductor chip, respectively. In addition, the first through-via and the second through-via penetrate the first encapsulating layer and the second encapsulating layer, (Continued)

respectively, and the second through-via is electrically connected between the second semiconductor chip and the first through-via. A method for forming the chip package are also provided.

20 Claims, 20 Drawing Sheets

(56) References Cited

U.S. PATENT DOCUMENTS

| | | | |
|---|---|---|---|
| 2015/0282367 A1* | 10/2015 | Barth | H05K 13/00 |
| | | | 361/728 |
| 2016/0172402 A1* | 6/2016 | Katkar | H10F 39/804 |
| 2017/0116458 A1* | 4/2017 | Liu | H01L 23/3135 |
| 2017/0256496 A1* | 9/2017 | Lin | H01L 21/486 |
| 2017/0287874 A1* | 10/2017 | Fang | H01L 24/11 |
| 2018/0247916 A1* | 8/2018 | Lee | H01L 23/3128 |
| 2019/0096866 A1* | 3/2019 | Hsu | H01L 24/73 |
| 2019/0164863 A1* | 5/2019 | Cho | H01L 24/32 |
| 2021/0265274 A1* | 8/2021 | Joo | H01L 23/5389 |

OTHER PUBLICATIONS

The office action dated Sep. 28, 2023 issued in the counterpart TW patent application 112102488, including search report.

* cited by examiner

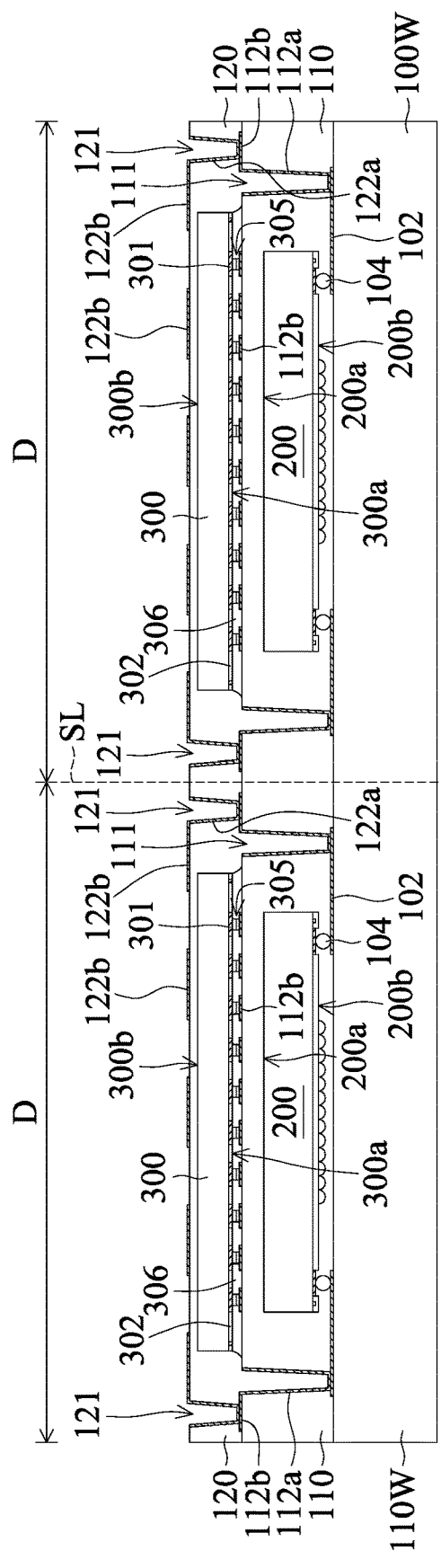
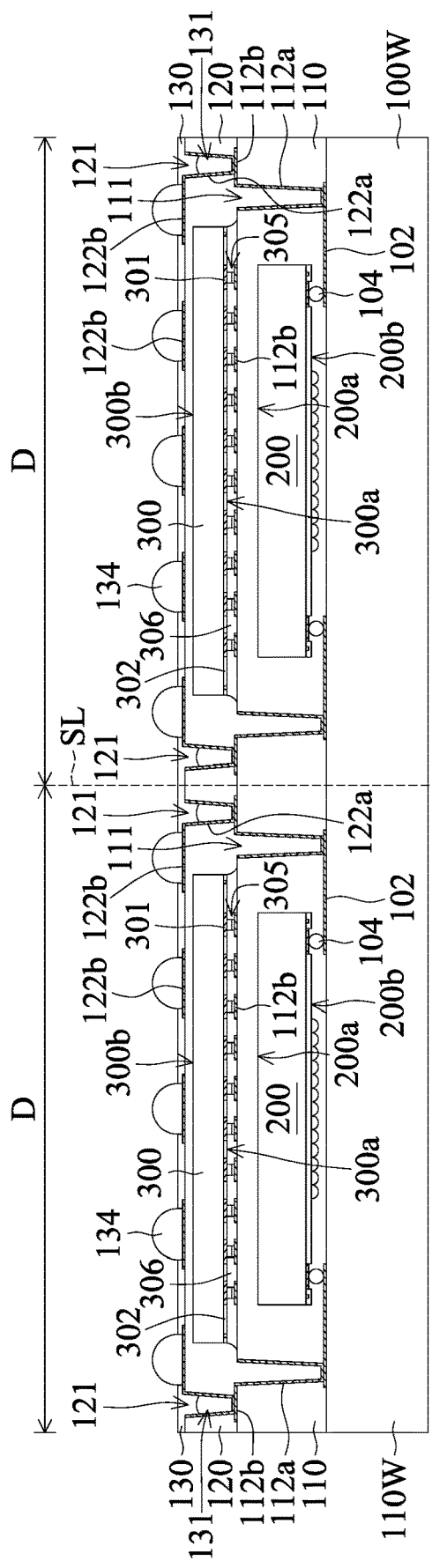
FIG. 3C
FIG. 3D

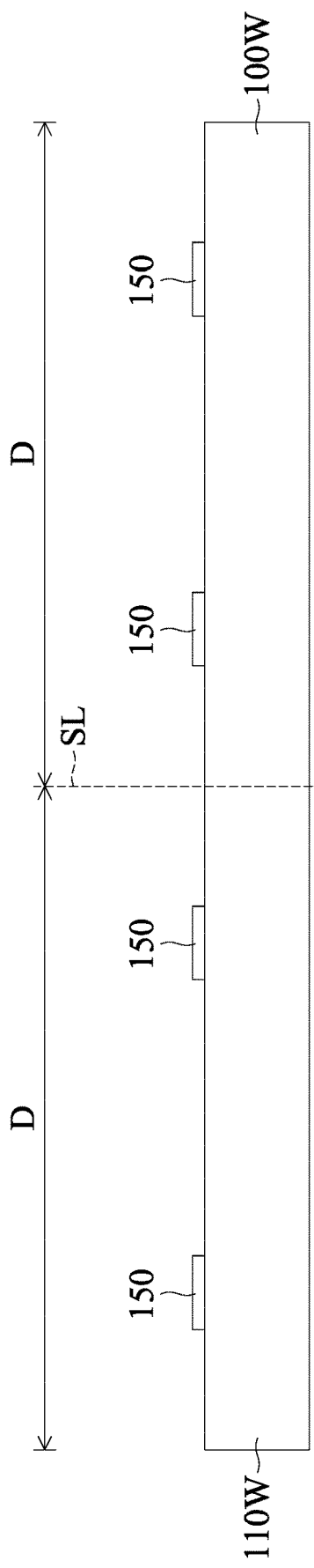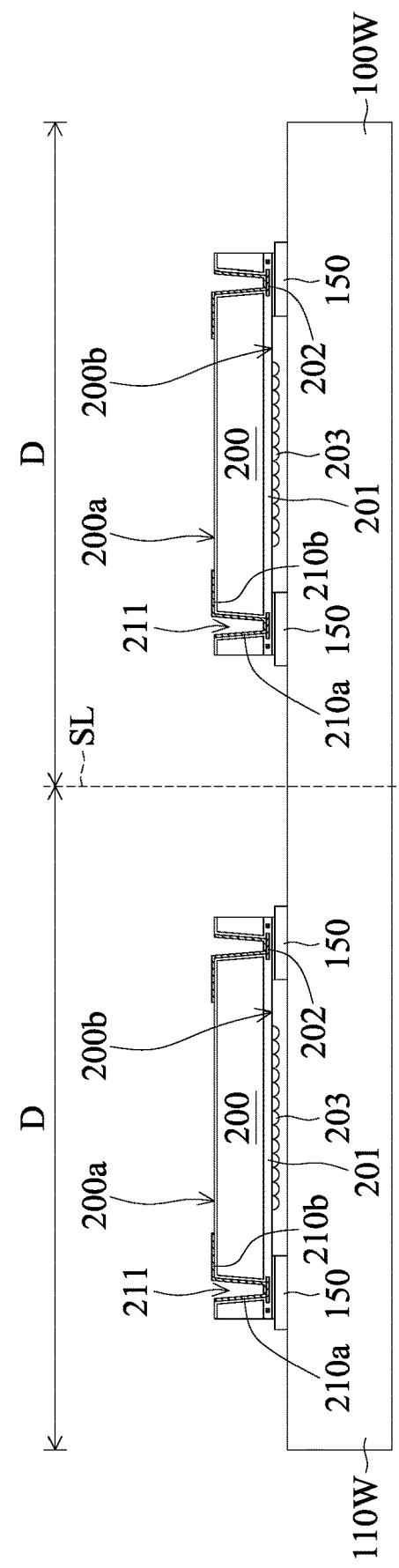

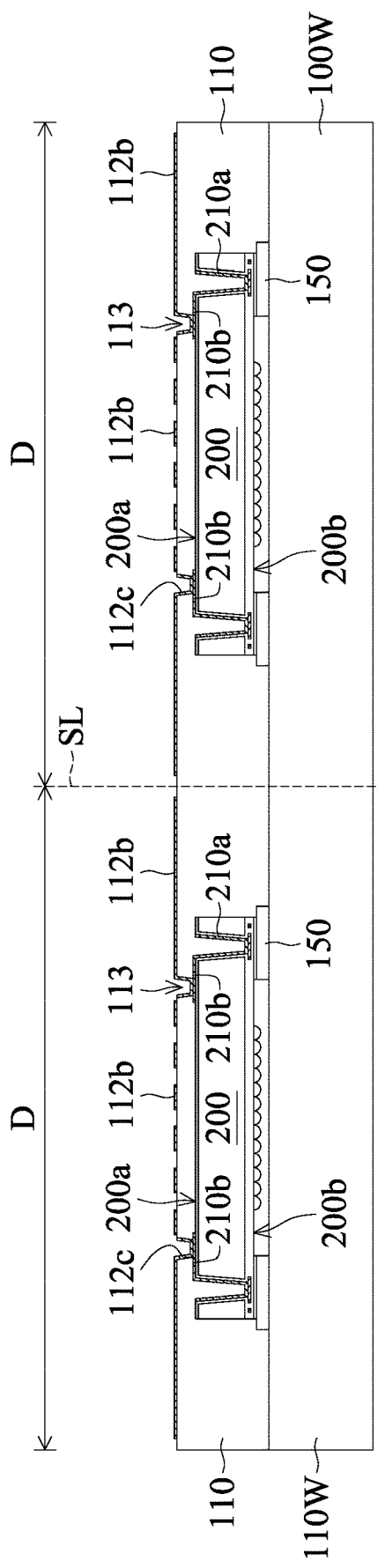
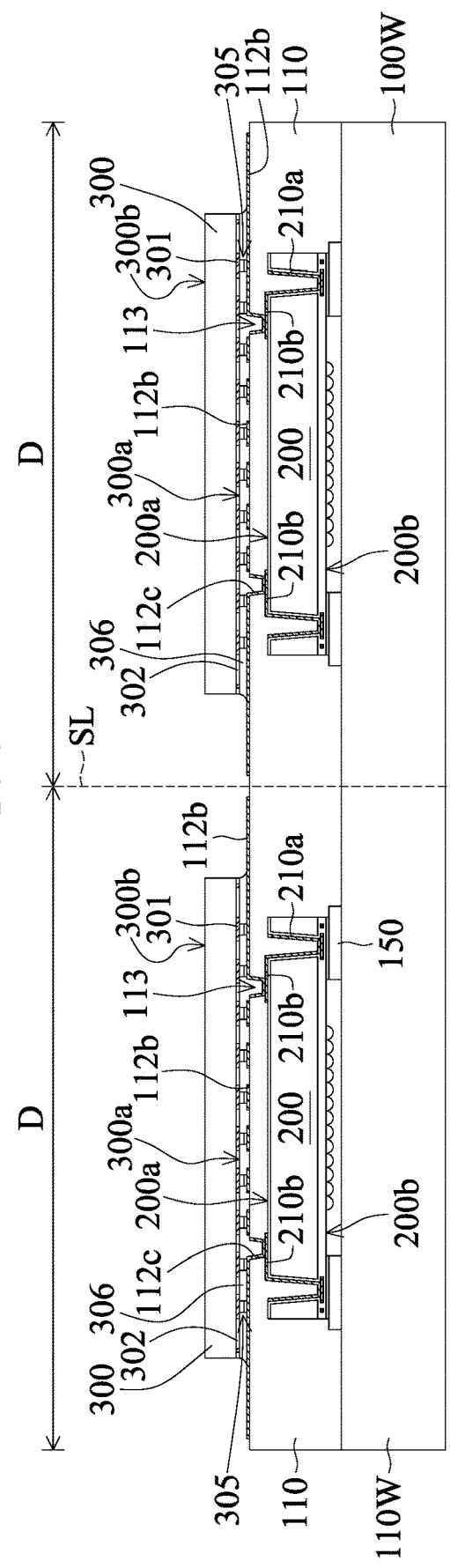
FIG. 7A
FIG. 7B

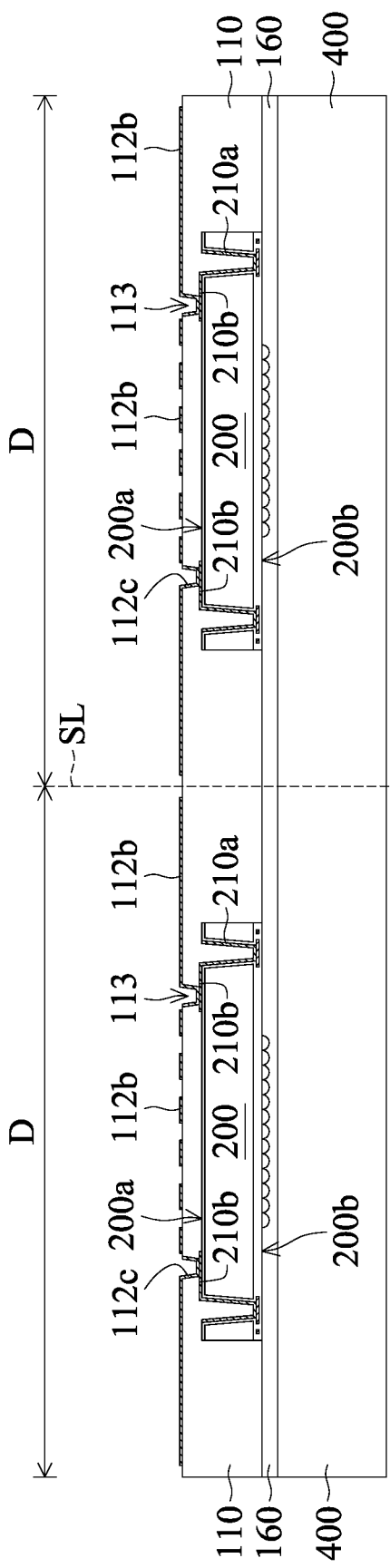
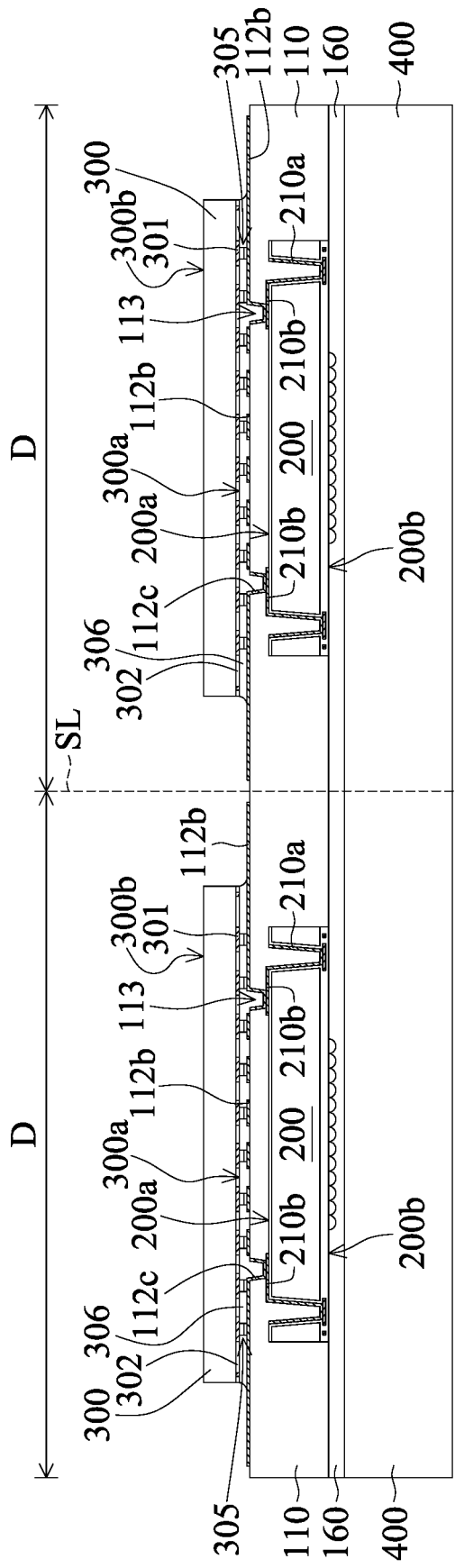
FIG. 11A
FIG. 11B

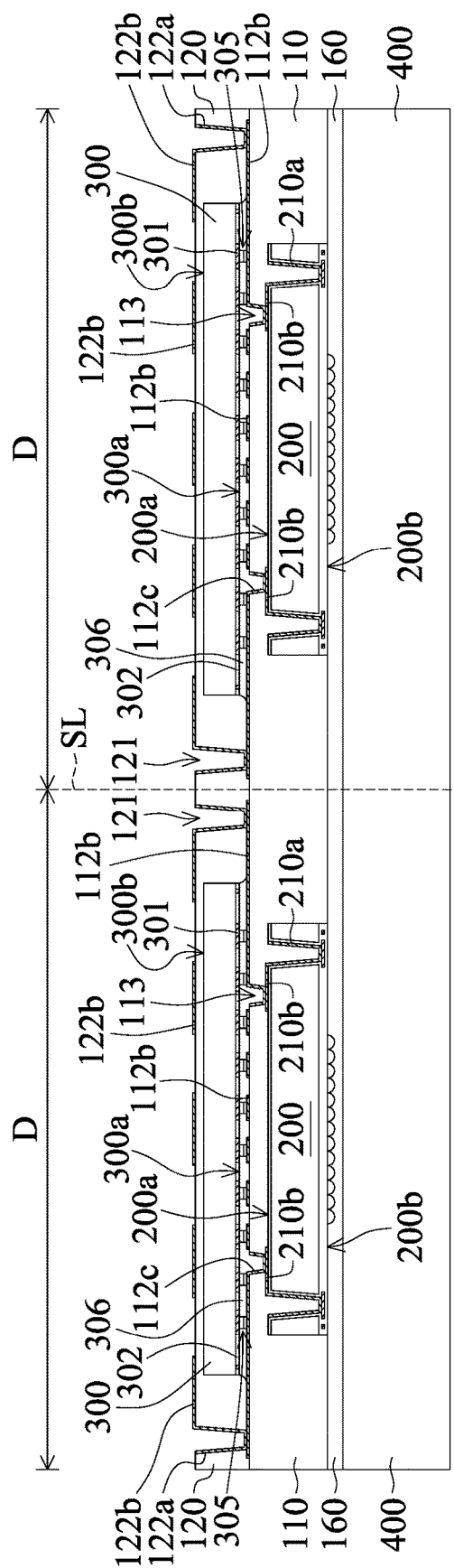
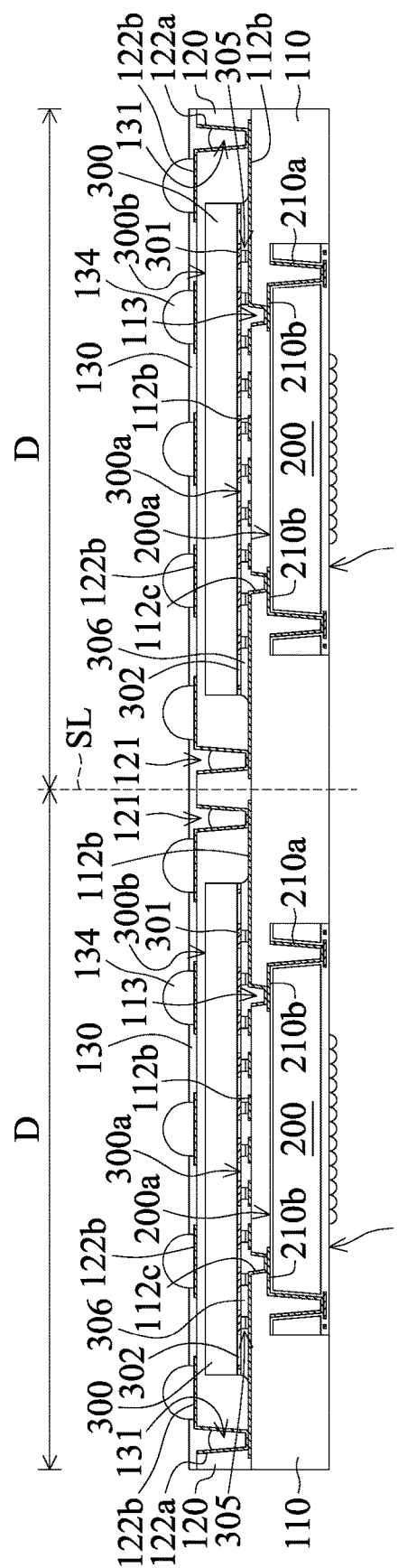
FIG. 11C
FIG. 11D

CHIP PACKAGE AND METHOD FOR FORMING THE SAME

CROSS REFERENCE TO RELATED APPLICATIONS

This application claims the benefit of U.S. Provisional Application No. 63/303,429, filed Jan. 26, 2022, the entirety of which is incorporated by reference herein.

BACKGROUND OF THE INVENTION

Field of the Invention

The invention relates to package technology, and in particular to a chip package and a method for forming the same.

Description of the Related Art

Optoelectronic devices (e.g., image-sensing devices) play an important role in capturing images and have been widely used in electronic products such as digital cameras, digital video recorders, and mobile phones. The chip packaging process is an important step in the fabrication of an electronic product. Chip packages not only protect sensing chips from outside environmental contaminants, but they also provide electrical connection paths between the electronic elements inside and those outside of the chip packages.

With the increase of functions and reduction of size of electronic products, system-in-package (SiP) technology has become an important technology to integrate different types of electronic devices (e.g., logic chips, sensing chips, memory chips, etc.) into a single package. Moreover, due to the rapid development of artificial intelligence (AI), heterogeneous integration has become an important trend in AI chips. SiP technology for heterogeneous integration can improve system performance while reducing chip size, power consumption, and manufacturing costs.

BRIEF SUMMARY OF THE INVENTION

An embodiment of the invention provides a chip package that includes: a first semiconductor chip having a first surface and a second surface opposite the first surface; a second semiconductor chip stacked on the second surface and having a third surface facing the second surface and a fourth surface opposite the third surface; a first encapsulating layer surrounding the first semiconductor chip; a second encapsulating layer surrounding the second semiconductor chip; a first through-via penetrating through the first encapsulating layer; and a second through-via, penetrating through the second encapsulating layer and electrically connected between the second semiconductor chip and the first through-via.

An embodiment of the invention provides a chip package that includes: a first semiconductor chip having a first surface and a second surface opposite the first surface; a second semiconductor chip stacked on the second surface and having a third surface facing the second surface and a fourth surface opposite the third surface; a first encapsulating layer surrounding the first semiconductor chip, wherein a portion of the first encapsulating layer extends over the first surface; a second encapsulating layer surrounding the second semiconductor chip, wherein a portion of the second encapsulating layer extends between the second surface and the third surface; a first through-via penetrating through the first encapsulating layer; a second through-via penetrating through the second semiconductor chip; and a third through-via penetrating through the portion of the second encapsulating layer, and electrically connected between the first through-via and the second through-via.

An embodiment of the invention provides a method for forming a chip package that includes: forming a first redistribution layer and a conductive bump on a transparent substrate, wherein the conductive bump is formed on the first redistribution layer; bonding a first semiconductor chip to the first redistribution layer via the conductive bump; forming a first encapsulating layer on the transparent substrate and covering the first semiconductor chip; forming a second redistribution layer on the first encapsulating layer, and forming a first through-via penetrating through the first encapsulating layer and electrically connected between the first redistribution layer and the second redistribution layer; stacking a second semiconductor chip on the first encapsulating layer on the first semiconductor chip; forming a second encapsulating layer on the first encapsulating layer and covering the second semiconductor chip; and forming a third redistribution layer on the second encapsulating layer, and forming a second through-via to penetrate through the entire second encapsulating layer and electrically connected to the second redistribution layer.

An embodiment of the invention provides a method for forming a chip package that includes: forming an insulating dam structure on a transparent substrate; bonding a first semiconductor chip to the transparent substrate via the insulating dam structure, wherein the first semiconductor chip has a first through-via corresponding to the dam structure and wherein a first redistribution layer is on the first semiconductor chip and electrically connected to the first through-via; forming a first encapsulating layer on the transparent substrate and covering the first semiconductor chip; forming a second redistribution layer on the first encapsulating layer, and forming a second through-via through a portion of the first encapsulating layer and electrically connected between the first redistribution layer and the second redistribution layer; stacking a second semiconductor chip on the first encapsulating layer above the first semiconductor chip; forming a second encapsulating layer on the first encapsulating layer and covering the second semiconductor chip; and forming a third redistribution layer on the second encapsulating layer, and forming a third through-via penetrating through the entire second encapsulating layer and electrically connected between the third redistribution layer and the second redistribution layer.

An embodiment of the invention provides a method for forming a chip package that includes: bonding a first semiconductor chip to a carrier substrate, wherein the first semiconductor chip has a first through-via and a first redistribution layer extending over the first semiconductor chip and electrically connected to the first through-via; forming a first encapsulating layer on the carrier substrate and covering the first semiconductor chip; forming a second redistribution layer on the first encapsulating layer, and forming a second through-via through a portion of the first encapsulating layer and electrically connected between the first redistribution layer and the second redistribution layer; stacking a second semiconductor chip on the first encapsulating layer on the first semiconductor chip; forming a second encapsulating layer on the first encapsulating layer and covering the second semiconductor chip; forming a third redistribution layer on the second encapsulating layer, and forming a third through-via penetrating through the entire second encapsulating layer and electrically connected between the third redistribution layer and the second redistribution layer; and removing the carrier substrate.

BRIEF DESCRIPTION OF THE FIGS

The present disclosure can be more fully understood by reading the subsequent detailed description and examples with references made to the accompanying FIGS., wherein:

FIGS. 3A to 3D are cross-sectional views of a method for forming a chip package in accordance with some embodiments of the present disclosure.

FIGS. 5A to 5F are cross-sectional views of a method for forming a chip package in accordance with some embodiments of the present disclosure.

FIGS. 7A to 7D are cross-sectional views of a method for forming a chip package in accordance with some embodiments of the present disclosure.

FIGS. 11A to 11D are cross-sectional views of a method for forming a chip package in accordance with some embodiments of the present disclosure.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Moreover, when a first material layer is referred to as being on or overlying a second material layer, the first material layer may be in direct contact with the second material layer, or separated from the second material layer by one or more material layers.

A chip package according to some embodiments of the present disclosure may be used to package micro-electromechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of a plurality of wafers having integrated circuits.

Figure 2:
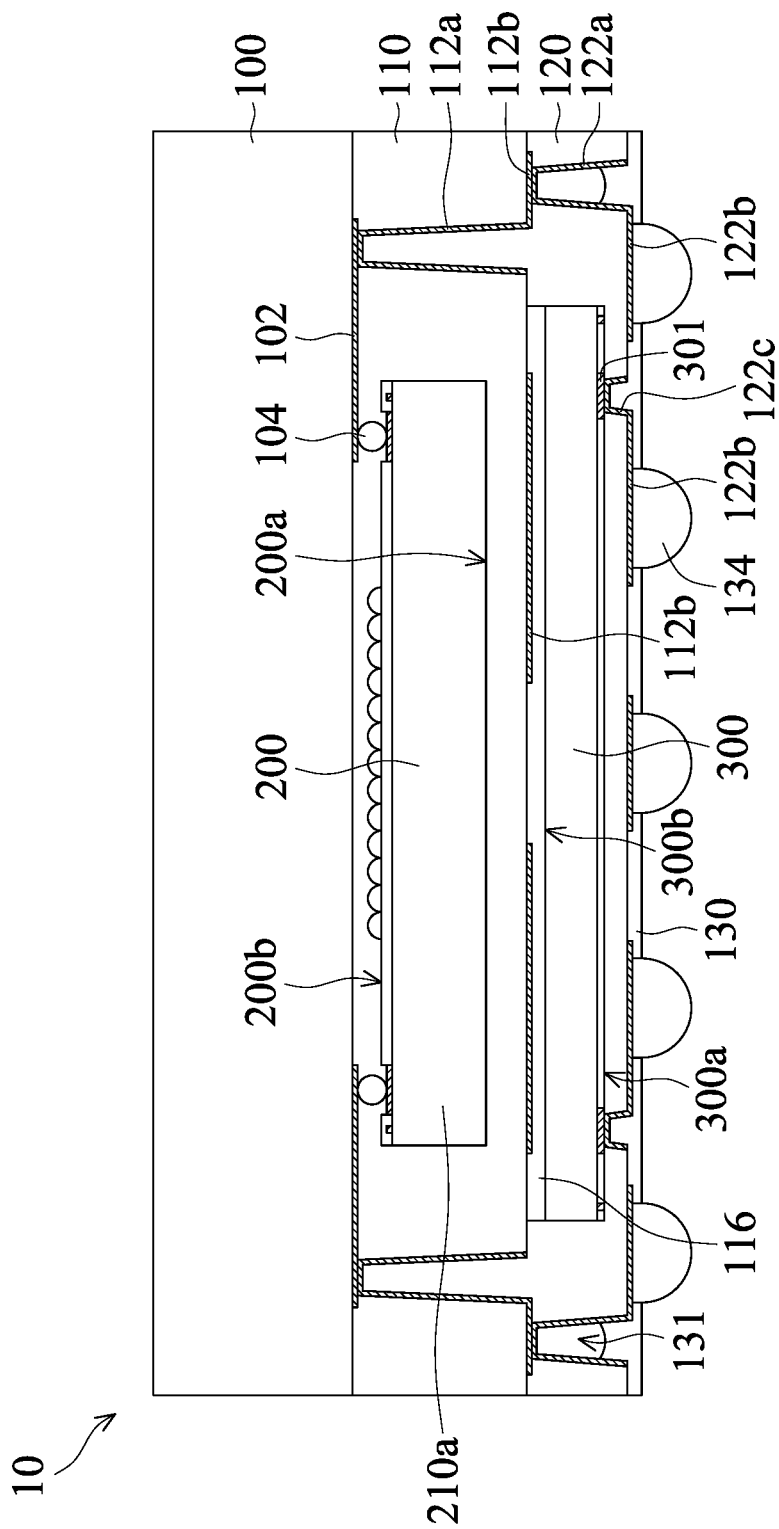
FIG. 2 is a cross-sectional view of a chip package in accordance with some embodiments of the present disclosure.

Referring to FIG. 2, which illustrates a cross-sectional of a chip package 10 in accordance with some embodiments of the present disclosure. The chip package 10 has a heterogeneous integrated structure and includes semiconductor chips 200 and 300, encapsulating layers 110 and 120, through-vias 112a, 122a, and 122c. In some embodiments, the semiconductor chip 200 is an image-sensing chip, such as a CMOS image sensor (CIS) chip. The semiconductor chip 200 has two opposing surfaces 200a and 200b. The surface 200b (e.g., the upper surface) is an active surface of the semiconductor chip 200 and the surface 200a (e.g., the lower surface) is a non-active surface of the semiconductor chip 200. The semiconductor chip 200 includes a sensing area (not shown). The sensing area may be adjacent to the surface 200b of semiconductor chip 200, and the sensing area includes a sensing device (not shown). For example, the sensing area has an image sensing device therein. In other some embodiments, the sensing area of semiconductor chip 200 includes a device for sensing biological features (e.g., a fingerprint recognition device), a device for sensing environmental features (e.g., a temperature sensing device, a humidity sensing device, a pressure sensing device, a capacitive sensing device), or other suitable sensing devices.

Figure 1A:
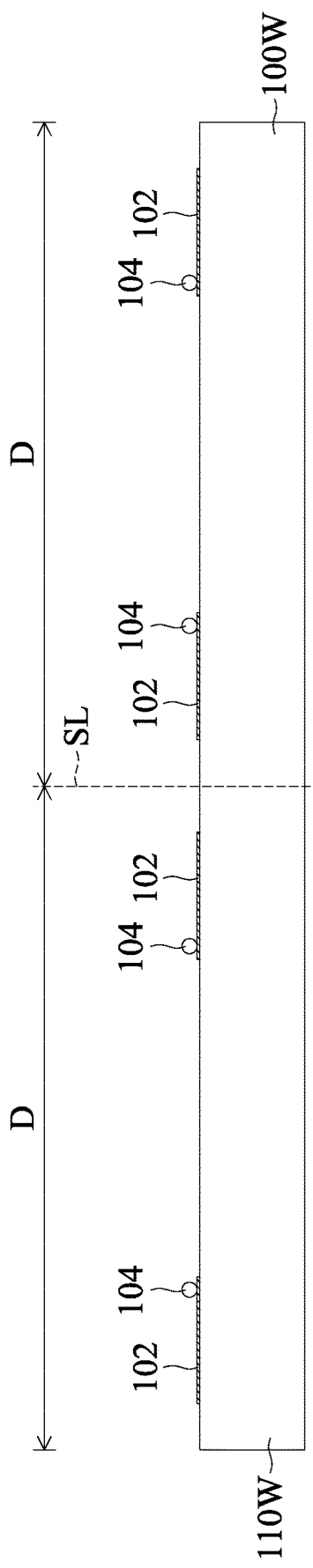
FIGS. 1A to 1F are cross-sectional views of a method for forming a chip package in accordance with some embodiments of the present disclosure.
Figure 1B:
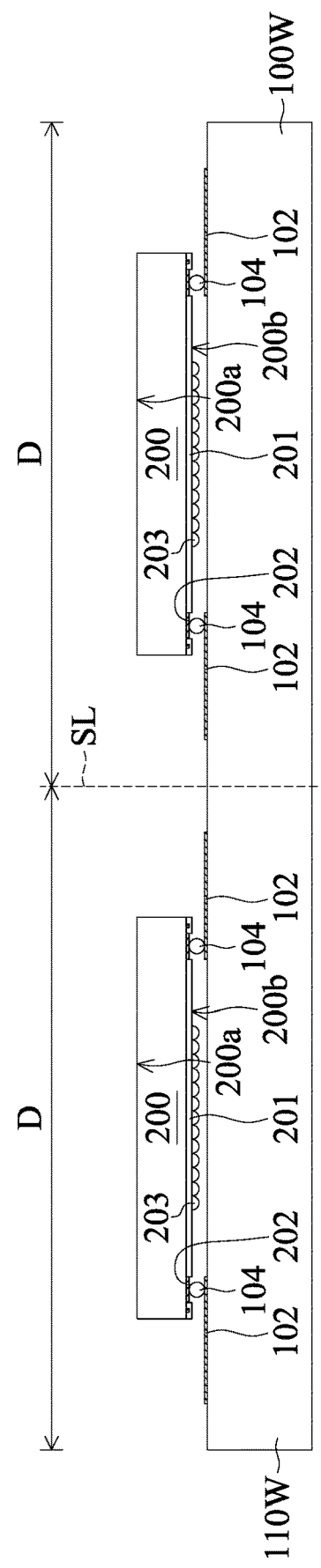

The semiconductor chip 200 includes an insulating layer 201 (as shown in FIG. 1B) that has an upper surface defining as the surface 200b of the semiconductor chip 200. In some embodiments, the insulating layer 201 includes an interlayer dielectric (ILD) layer, an inter-metal dielectric (IMD) layer, a passivation layer, or a combination of thereof. In some embodiments, the insulating layer 201 includes an inorganic material, such as silicon oxide, silicon nitride, silicon nitride, metal oxide or a combination of thereof or other suitable insulating material.

In some embodiments, the insulating layer 201 has one or more conductive pads 202 therein (as shown in FIG. 1B). In some embodiments, the conductive pad 202 is a single conductive layer or a multi-layer conductive structure. To simplify the diagram, only two conductive pads 202 with a single conductive layer are shown herein as an example. In some embodiments, the insulating layer 201 includes openings that expose the corresponding conductive pad 202. In some embodiments, the sensing device in the sensing area is electrically connected to the conductive pads 202 through the interconnect structure (not shown) within the substrate of the semiconductor chip 200 and the insulating layer 201.

In some embodiments, the semiconductor chip 200 further comprises an optical component 203 (as shown in FIG. 1B) disposed on the insulating layer 201 and corresponding to the sensing area. In some embodiments, the optical component 203 includes a microlens array, a filter layer, a combination thereof, or another suitable optical component.

In some embodiments, the semiconductor chip 300 in the chip package 10 has two opposing surfaces 300a and 300b. The surface 300a (e.g., the lower surface) is an active surface of the semiconductor chip 300 and the surface 300b (e.g., the upper surface) is a non-active surface of the semiconductor chip 300. Moreover, the semiconductor chip 200 is stacked on the surface 300b of semiconductor chip 300, and the surface 200a of the semiconductor chip 200 faces the surface 300b of semiconductor chip 300. In some embodiments, the semiconductor chip 300 is an artificial intelligence (AI) chip. In those cases, when the semiconductor chip 200 is a CMOS image sensor (CIS) chip, the semiconductor chip 300 has a size larger than the size of semiconductor chip 200. For example, the areas of surfaces 300a and 300b of semiconductor chip 300 are larger than the areas of surfaces 200a and 200b of semiconductor chip 200.

Figure 1C:
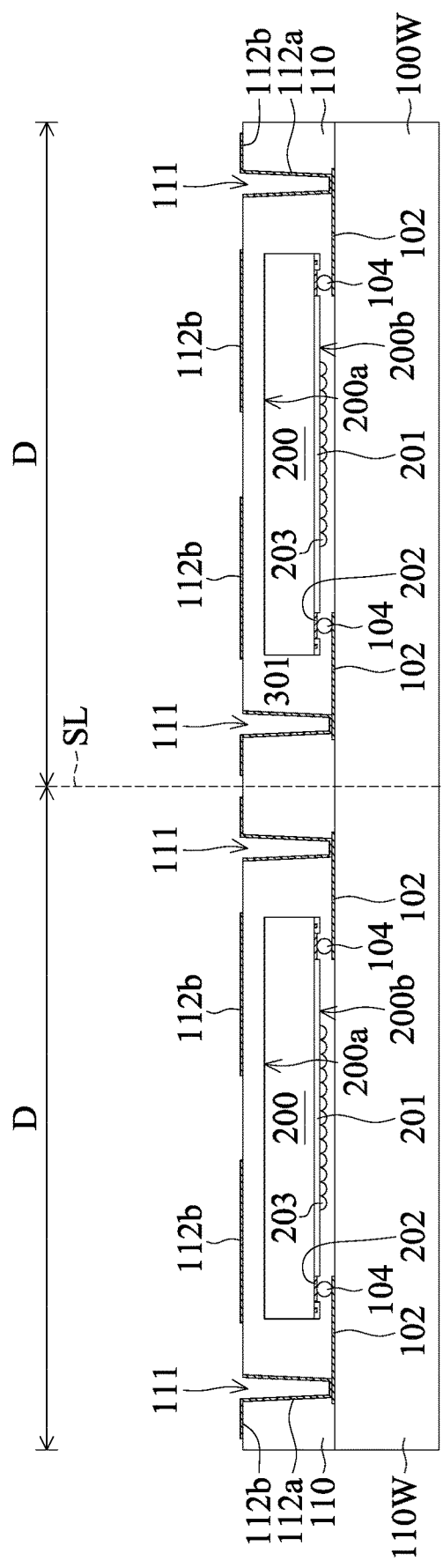
Figure 1D:
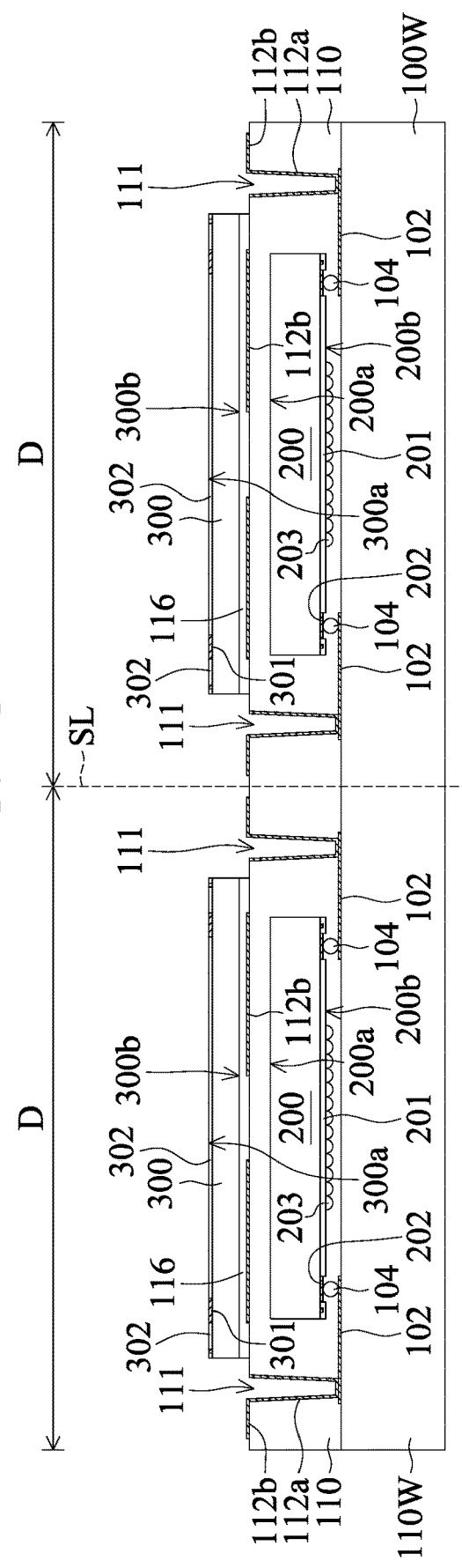

Similarly, semiconductor chip 300 includes an insulating layer 302 (as shown in FIG. 1D) having an upper surface that defines as a surface 300a of semiconductor chip 300. In some embodiments, the insulating layer 302 has the same or similar structure and material as those of the insulating layer 201 of semiconductor chip 200. Moreover, the insulating layer 302 has one or more conductive pads 301 (as shown in FIG. 1D) formed in the insulating layer 302. In some embodiments, the conductive pad 301 is a single conductive layer or a multi-layer conductive structure. To simplify the diagram, only two conductive pads 301 with a single conductive layer are shown herein as an example. In some embodiments, the insulating layer 302 includes openings that expose the corresponding conductive pads 301. In some embodiments, the conductive pads 301 can be electrically connected to the integrated circuit of the semiconductor chip 300 through the interconnect structure (not shown) within the substrate of the semiconductor chip 300 and the insulating layer 302.

In some embodiments, the encapsulating layer 110 and 120 in chip package 10 surround corresponding semiconductor chips, respectively. For example, the encapsulating layer 110 surrounds the corresponding semiconductor chip 200, and the encapsulating layer 120 surrounds the corresponding semiconductor chip 300. In some embodiments, a portion of the encapsulating layer 120 extends over the active surface (e.g., surface 300a) of semiconductor chip 300. Similarly, a portion of the encapsulating layer 110 extends between the non-active surface (e.g., surface 300b) of the semiconductor chip 300 and the non-active surface (e.g., surface 200a) of the semiconductor chip 200. In some embodiments, the encapsulating layers 110 and 120 include a molding compound material, which is made of epoxide, resin, or plasticizable polymer.

Figure 1E:
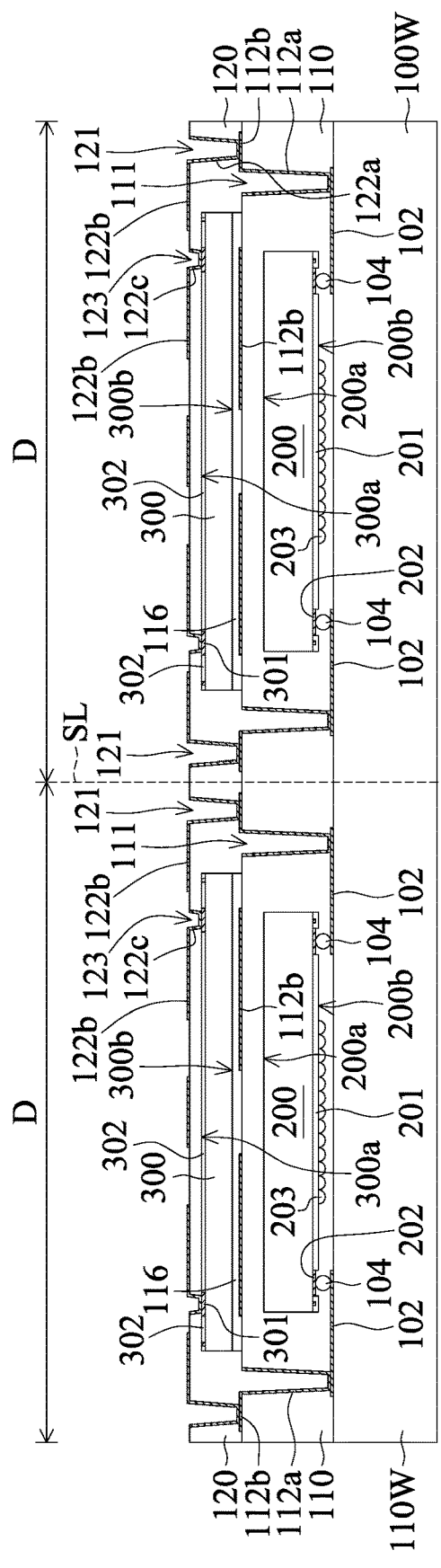

In some embodiments, the encapsulating layer 120 has openings 121 and 123 (as shown in FIG. 1E) formed in the encapsulating layer 120. The openings 121 penetrate through the entire encapsulating layer 120 and the openings 123 penetrate through the portion of the encapsulating layer 120 extending over the surface 300a of the semiconductor chip 300. Moreover, the through-vias 122a and 122c in the chip package 10 are formed in the openings 121 and 123, respectively, and conformally extend on the sidewalls and bottom of the corresponding openings. The through-via 122c is in direct contact with the corresponding conductive pad 301, so as to be electrically connected to the semiconductor chip 300. Similarly, the encapsulating layer 110 has openings 111 therein (as shown in FIG. 1D). The opening 111 penetrates through the entire encapsulating layer 110. Moreover, the through-via 112a in the chip package 10 is formed in the opening 111, and conformally extends on the sidewalls and bottom of the opening 111.

In some embodiments, the chip package 10 further includes redistribution layers (RDLs) 102, 112b, and 122b each having a fan-out structure. The redistribution layer 102 is formed on the encapsulating layer 110 and is electrically connected to the through-via 122a and the conductive pad 202 of the semiconductor chip 200 via the conductive bumps 104 (e.g., micro bumps). The redistribution layer 112b is formed between the encapsulating layer 110 and the encapsulating layer 120 and is electrically connected between the through-via 112a and the through-via 122a. The redistribution layer 122b is formed below the encapsulating layer 120. The redistribution layer 122b is electrically connected between through-vias 122a and 122c. In some embodiments, the redistribution layer 112b is formed from the same material layer as that of the through-via 112a, and the redistribution layer 122b is formed from the same material layer as those of the through-vias 122a and 122c. For example, the redistribution layers conformally extend to the sidewalls and bottom of the corresponding openings. Thereof, the redistribution layer formed within the opening is also referred to as the through-via. In some embodiments, the redistribution layers 102, 112b, and 122b include aluminum, titanium, tungsten, copper, or combinations thereof.

In some embodiments, the chip package 10 further includes a cover plate 100 disposed above the semiconductor chip 200 and covering the encapsulating layer 110 and the redistribution layers 102 to protect the optical components 203. In some embodiments, the cover plate 100 may include glass, quartz, transparent polymer material or another suitable transparent material. Moreover, a portion of the encapsulating layer 110 extends between the semiconductor chip 200 and the cover plate 100 to cover the surface 200b of the semiconductor chip 200 and expose the optical component 203. As a result, the cover plate 100, the encapsulating layer 110 and the semiconductor chip 200 together enclose a cavity above the sensing area, so that the optical component 203 is formed in the cavity.

In some embodiments, the chip package 10 further includes an adhesive layer 116 in direct contact with the non-active surface (e.g., surface 300b) of the semiconductor chip 300 and the portion of the encapsulating layer 110 that extends over the surface 200a of the semiconductor chip 200, such that the semiconductor chip 300 is attached below the encapsulating layer 110.

In some embodiments, the chip package 10 further includes a passivation layer 130 disposed on the active surface (e.g., surface 300a) of the semiconductor chip 300 and filling openings 121 and 123 (indicated in FIG. 1E). In some embodiments, the passivation layer 130 includes an epoxy resin, a solder mask, an inorganic material (e.g., silicon oxide, silicon nitride, silicon oxynitride, metal oxide, or a combination of thereof), an organic polymer material (such as polyimide, butylcyclobutene (BCB), parylene, polynaphthalenes, fluorocarbons, or acrylates), or another suitable insulating material. In some embodiments, the passivation layer 130 does not fully fill the opening 121, such that a hole 131 is formed under the passivation layer 130 in the opening 121. During the thermal treatment in the manufacturing process, the hole 131 can be a buffer between the passivation layer 130 and through-via 122a. Unwanted stress, which is induced between the passivation layer 130 and through-via 122a as a result of mismatch of thermal expansion coefficients, is reduced. In one embodiment, the interface between the hole 131 and the passivation layer 146 has an arcuate contour.

In some embodiments, the passivation layer 130 has openings to expose portions of the redistribution layer 122b. Moreover, the conductive structures 134 (e.g., solder balls, bumps, or conductive posts) are disposed on the active surface (e.g., surface 300a) of the semiconductor chip 300 and electrically connected to the exposed redistribution layer 122b through the openings in the passivation layer 130. As a result, the conductive structures 134 are electrically connected to the through-vias 122a and 122c. In some embodiments, the conductive structures 134 include tin, lead, copper, gold, nickel, or a combination of thereof.

FIGS. 1A to 1F are cross-sectional view of a method for forming a chip package 10 in accordance with some embodiments of the present disclosure. Elements in FIGS. 1A to 1F that are the same as those in FIG. 2 are labeled with the same reference numbers as in FIG. 2 and are not described again for brevity. Referring to FIG. 1A, a substrate 100W is provided. The substrate 100W has chip regions and a scribe-line region surrounding these chip regions and separating adjacent chip regions. To simplify the diagram, only two complete chip regions D and a scribe-line region SL separating these chip regions D are depicted herein. In some embodiments, the substrate 100W is a glass wafer to facilitate the wafer-level package process and serves as the cover plate 100 in the chip package 10. Next, redistribution layers 102 and conductive bumps 104 are formed on the substrate 100W, where the conductive bumps 104 are formed on the redistribution layers 102.

Referring to FIG. 1B, the semiconductor chip 200 is bonded onto the redistribution layers 102 of the corresponding chip region D via the conductive bumps 104. In some embodiments, the semiconductor chip 200 includes an insulating layer 201. The insulating layer 201 has one or more conductive pads 202 therein. In some embodiments, the semiconductor chip 200 further includes an optical component 203 disposed on the insulating layer 201.

Referring to FIG. 1C, an encapsulating layer 110 is formed on the substrate 100W and covers the surface 200a and sidewalls of the semiconductor chip 200 in each chip region D. Afterwards, openings 111 that penetrate through the encapsulating layer 110 are formed by an etching process or laser drilling process, to expose the redistribution layers 102 in each chip region D. In some embodiments, after forming the openings 111, redistribution layers 112b are formed on the encapsulating layer 110 in each chip region D, and through-vias 112a are formed in the openings 111 in each chip region D. The through-via 112a is electrically connected between the redistribution layer 102 and redistribution layer 112b. In some embodiments, the redistribution layer 112b and the through-via 112a are formed by depositing and patterning the same conformal metal layer.

Referring to FIG. 1D, the semiconductor chip 300 is stacked on the semiconductor chip 200 in the corresponding chip region D by the adhesive layer 116. For example, the adhesive layer 116 is attached to the non-active surface (e.g., surface 300b) of the corresponding semiconductor chip 300, and then is in directly contact with the portion of the encapsulating layer 110 extending over the surface 200a of the semiconductor chip 200, so that the semiconductor chip 300 is stacked on the corresponding semiconductor chip 200. In some embodiments, the semiconductor chip 300 includes an insulating layer 302 having an upper surface that defines as the surface 300a of semiconductor chip 300. The insulating layer 302 has one or more conductive pads 301 therein.

Referring to FIG. 1E, an encapsulating layer 120 is formed on the encapsulating layer 110 and in the openings 111 and covers the surface 300a and sidewalls of the semiconductor chip 300 in each chip region D. Afterwards, openings 121 and 123 are formed in the encapsulating layer 120 by an etching process or laser drilling process, forming. The openings 121 penetrate through the entire encapsulating layer 120, and the openings 123 penetrate through the portion of the encapsulating layer 120 extending over the surface 300a of the semiconductor chip 300. The openings 121 expose the redistribution layer 112b on the encapsulating layer 110 in each chip region D, and the openings 123 exposes the conductive pads 301 of the semiconductor chip 300 in each chip region D.

In some embodiments, after forming openings 121 and 123, the redistribution layer 122b is formed on encapsulating layer 120 in each chip region D, and through-vias 122a and 122c are respectively formed in openings 121 and 123 in each chip region D. The through-via 122a is electrically connected to the exposed redistribution layer 112b, and through-via 122c is electrically connected to the conductive pad 301 of the semiconductor chip 300. In some embodiments, the redistribution layer 122b and the through-vias 122a and 122c are formed by depositing and patterning the same conformal metal layer.

Figure 1F:
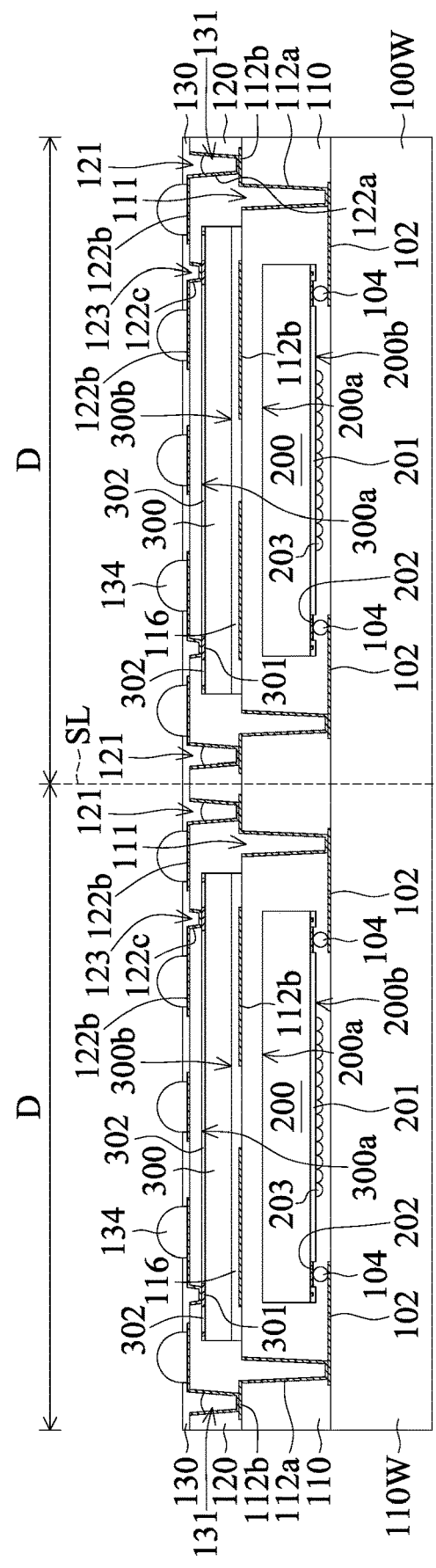

Referring to FIG. 1F, a passivation layer 130 is formed on the encapsulating layer 120 by a deposition process and fills the openings 121 and 123 of each chip region D (as shown in FIG. 1F) to cover the redistribution layer 122b and through-vias 122a and 122c. In some embodiments, the passivation layer 130 fully fills the opening 123 and only partially fills the opening 121, so that a hole 131 is formed in the opening 121. Next, one or more openings can be formed in the passivation layer 130 in each chip region D by lithography and etching processes to expose portions of the redistribution layer 122b. In some embodiments, a conductive structure 134 (e.g., a solder ball, a bump, or a conductive post) fills each of the openings in the passivation layer 130 by an electroplating process, a screen printing process, or another suitable process, to be electrically connected to the exposed portions of the redistribution layer 122b. In some embodiments, the conductive structure 134 includes tin, lead, copper, gold, nickel, or a combination of thereof.

After forming the conductive structure 134, the encapsulating layer 120, the encapsulating layer 110, and the substrate 100W are successively diced along the scribe-line region SL. For example, a dicing process can be performed using a dicing saw or laser process. After performing the dicing process, an individual chip package 10 is formed, as shown in FIG. 2.

Figure 4:
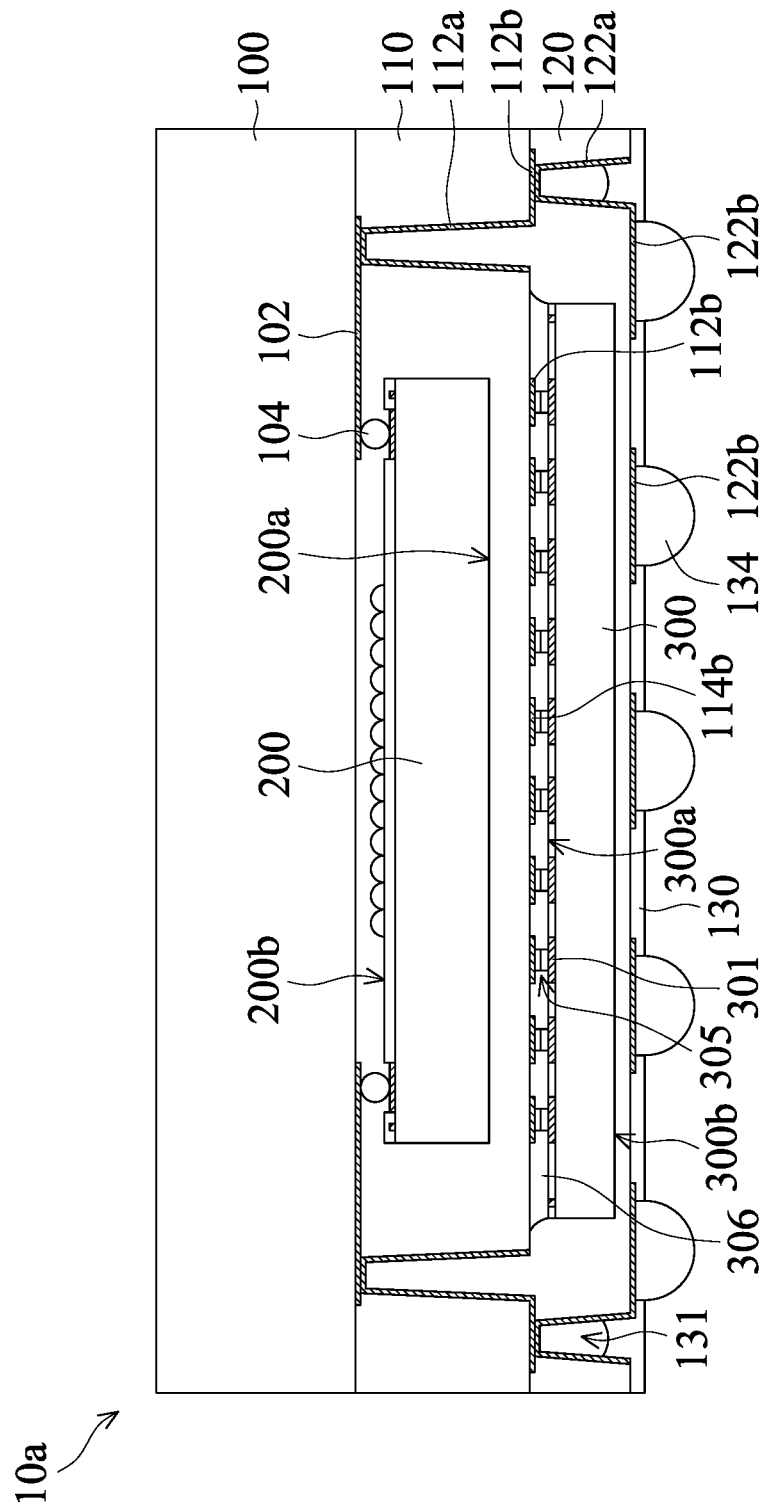
FIG. 4 is a cross-sectional view of a chip package in accordance with some embodiments of the present disclosure.

Referring to FIG. 4, which illustrates a cross-sectional view of the chip package 10a in accordance with some embodiments of the present disclosure. Elements in FIG. 4 that are the same as those in FIG. 2 are labeled with the same reference numbers as in FIG. 2 and are not described again for brevity. In some embodiments, the structure of chip package 10a is similar to the structure of chip package 10 in FIG. 2. The difference is that the active surface (e.g., surface 300a) of semiconductor chip 300 in chip package 10a faces the non-active surface (e.g., surface 200a) of semiconductor chip 200. In those cases, the chip package 10a further includes one or more conductive structures 305 (e.g., bumps or conductive posts) disposed on the active surface of semiconductor chip 300 and electrically connected to the through-via 112b. Moreover, the chip package 10a further includes an underfill layer 306 disposed between the encapsulating layer 110 and the semiconductor chip 300. The underfill layer 306 surrounds the conductive structure 305 and is surrounded by the encapsulating layer 120. In addition, since the active surface of semiconductor chip 300 is opposite to the conductive structure 305, the chip package 10a does not have the through-vias 122c as those in the chip package 10.

Figure 3A:
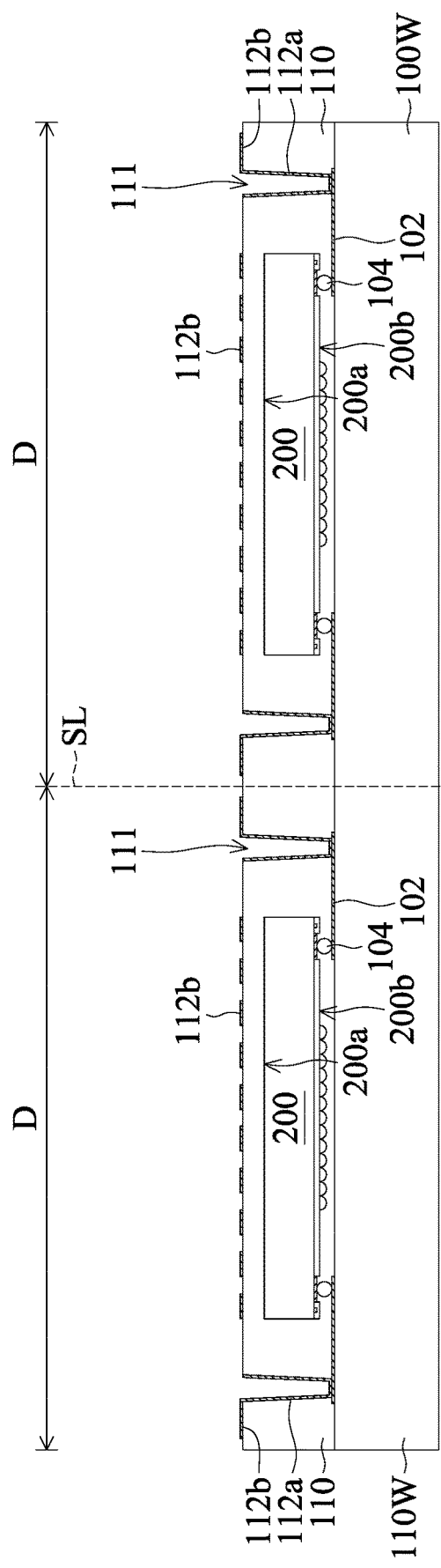

FIGS. 3A to 3D are cross-sectional view of a method for forming a chip package 10a in accordance with some embodiments of the present disclosure. Elements in FIGS. 3A to 3D that are the same as those in FIGS. 1A to 1F and 4 are labeled with the same reference numbers as in FIGS. 1A to 1F and 4 and are not described again for brevity. Referring to FIG. 3A, the structure as shown in FIG. 1B is provided. Next, an encapsulating layer 110 is formed on the substrate 100W and covers the surface 200a and sidewalls of the semiconductor chip 200 in each chip region D. Afterwards, openings 111 are formed to penetrate through the encapsulating layer 110 by an etching process or a laser drilling process, to expose the redistribution layers 102 in each chip region D. In some embodiments, after forming the opening 111, redistribution layers 112b are formed on the encapsulating layer 110 in each chip region D, and through-vias 112a are formed in the openings 111 in each chip region D. The through-via 112a is electrically connected between the redistribution layer 102 and redistribution layer 112b. In some embodiments, the redistribution layer 112b and through-via 112a are formed by depositing and patterning the same conformal metal layer. In other some embodiments, the pattern of the redistribution layers 112b is the same as the pattern of the redistribution layers 112b in chip package 10. It is understood that the design of the pattern of the redistribution layers 112b in chip package 10a depends on the arrangement of the conductive structures 305 and is not limited to the embodiment shown in FIG. 3A.

Figure 3B:
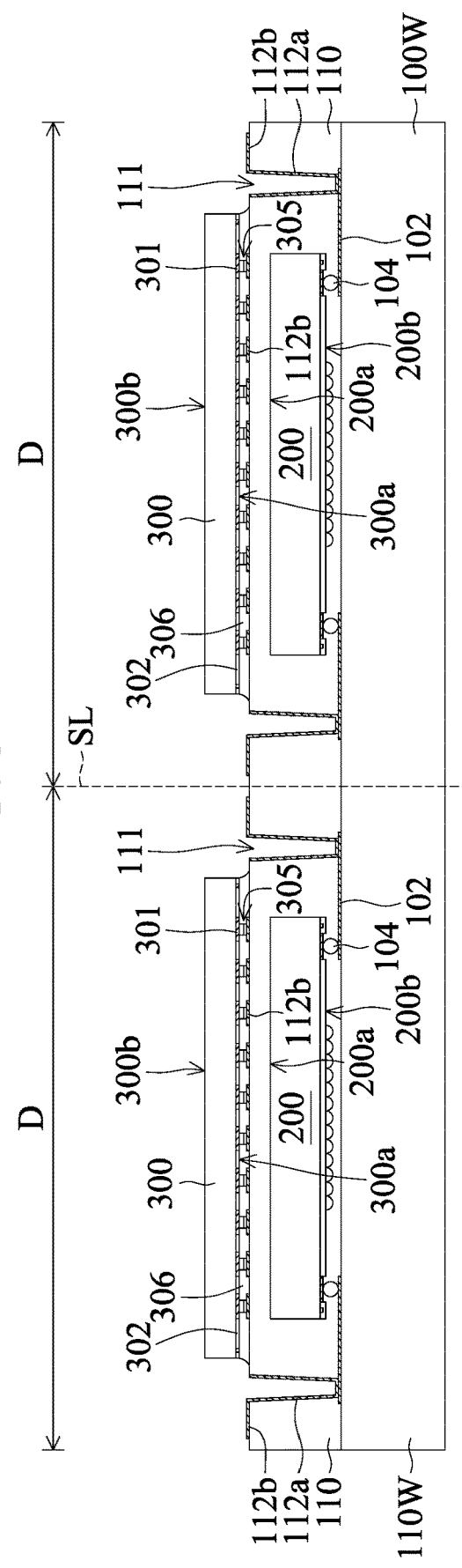

Referring to FIG. 3B, the semiconductor chip 300 is stacked on the semiconductor chip 200 in the corresponding chip region D by the underfill layer 306 and the conductive structure 305 formed on each of the conductive pads 301. For example, the conductive structures 305 are electrically connected to the corresponding redistribution layers 112b, and the underfill layer 306 is in direct contact with the portion of the encapsulating layer 110 extending over the surface 200a of the semiconductor chip 200, so that the semiconductor chip 300 stacked on the corresponding semiconductor chip 200. As a result, the active surface (e.g., surface 300a) of semiconductor chip 300 faces the non-active surface (e.g., surface 200a) of semiconductor chip 200, and the conductive structures 305 are electrically connected between semiconductor chip 300 and redistribution layers 112b.

Referring to FIG. 3C, an encapsulating layer 120 is formed to cover the surface 300b and the sidewalls of the semiconductor chip 300 in each chip region D according to the method illustrated in FIG. 1E, and openings 121 are formed in the encapsulating layer 120. Moreover, according to the method illustrated in FIG. 1E, redistribution layers 122b are formed on the encapsulating layer 120 and through-vias 122a are formed in the openings 121.

Referring to FIG. 3D, according to the method illustrated in FIG. 1F, a passivation layer 130 is formed on the encapsulating layer 120 and fills the openings 121 in each chip region D. Moreover, according to the method illustrated in FIG. 1F, a conductive structure 134 fills each opening in the passivation layer 130 to be electrically connected to the exposed portions of the redistribution layers 122b. Afterwards, the encapsulating layer 120, the encapsulating layer 110 and the substrate 100W are successively diced according to the method described in FIG. 1F. For example, a dicing process can be performed using a dicing saw or laser process. After performing the dicing process, an individual chip package 10a is formed, as shown in FIG. 4.

Figure 6:
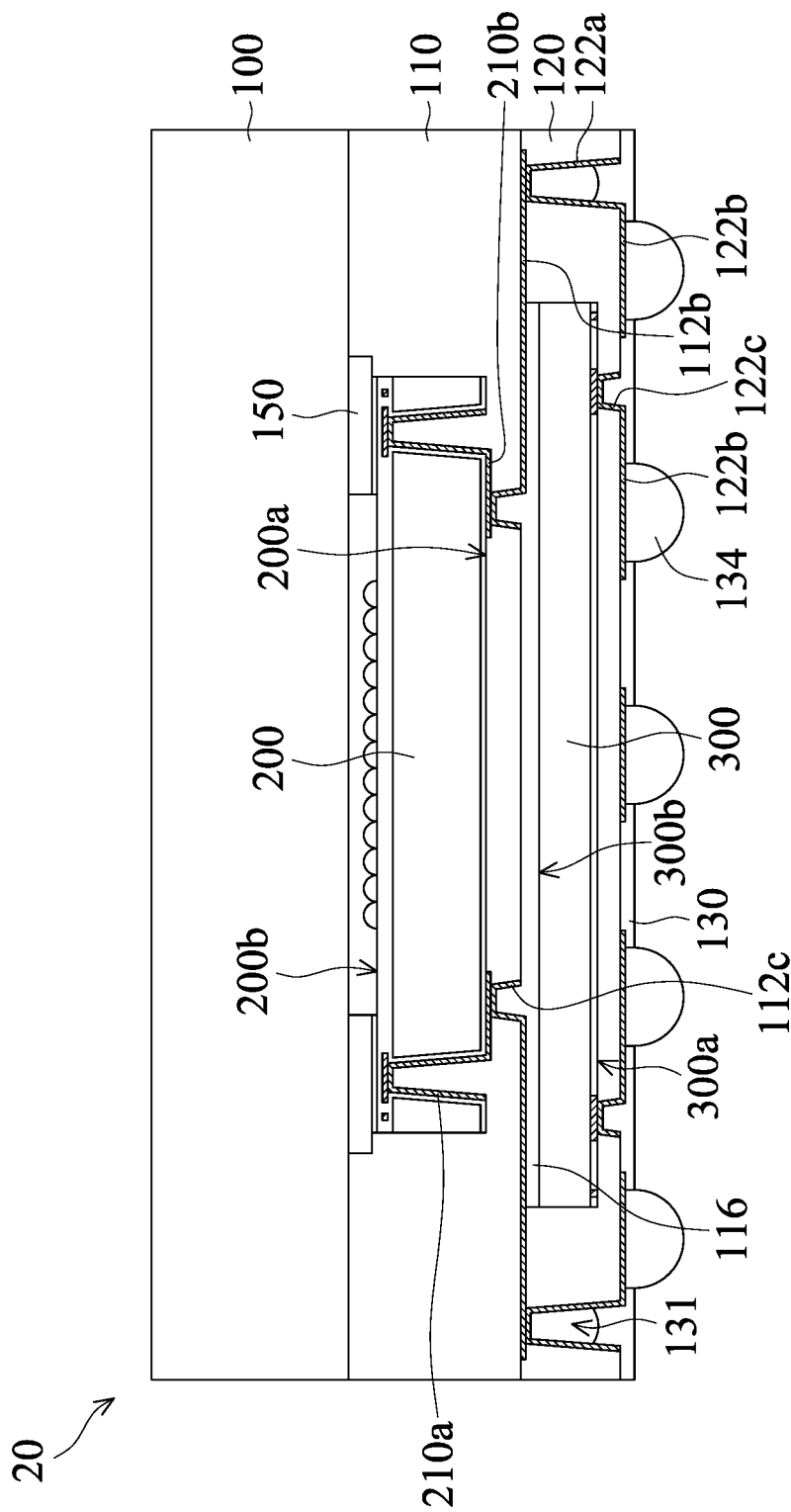
FIG. 6 is a cross-sectional view of a chip package in accordance with some embodiments of the present disclosure.

Referring to FIG. 6, which illustrates a cross-sectional view of a chip package 20 in accordance with some embodiments of the present disclosure. Elements in FIG. 6 that are the same as those in FIG. 2 are labeled with the same reference numbers as in FIG. 2 and are not described again for brevity. In some embodiments, the structure of the chip package 20 is similar to the structure of the chip package 10 in FIG. 2. The difference is that the chip package 20 has through-vias 210a penetrating through the semiconductor chip 200, and has through-vias 112c penetrating through the encapsulating layer 110 extending over the surface 200a of the semiconductor wafer 200. Unlike chip package 10 (which is electrically connected between semiconductor chip 200 and through-vias 122a by using the through-vias 112a), the chip package 20 is electrically connected between the semiconductor chip 200 and the through-vias 122a by using the through-vias 210a and 112c.

Figure 5C:
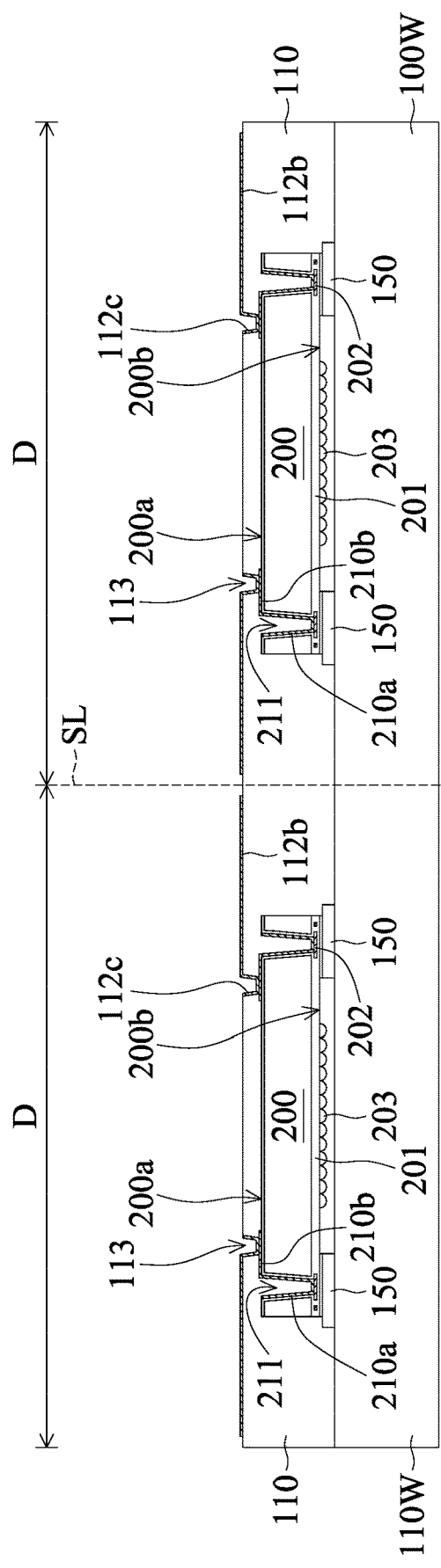

FIGS. 5A to 5F are cross-sectional view of a method for forming a chip package 20 in accordance with some embodiments of the present disclosure. Elements in FIGS. 5A to 5F that are the same as those in FIGS. 1A to 1F and 6 are labeled with the same reference numbers as in FIGS. 1A to 1F and 6 and are not described again for brevity. Referring to FIG. 5A, a substrate 100W is provided. The substrate W has two complete chip regions D and a scribe-line region SL separating these chip regions D. Next, a spacer layer (or is referred to as a dam) 150 is formed on the substrate 100W in each chip region D. In some embodiments, the spacer layer 150 include an epoxy resin, an inorganic material (e.g., silicon oxide, silicon nitride, silicon oxynitride, metal oxide, or a combination thereof), an organic polymer material (such as polyimide, butylcyclobutene (BCB), parylene, polynaphthalenes, fluorocarbons, or acrylates), a photoresist material, or another suitable insulating materials.

Referring to FIG. 5B, the semiconductor chip 200 is bonded to the spacer layer 150 in the corresponding chip region D. In some embodiments, the semiconductor chip 200 has openings 211 in the semiconductor chip 200 to expose conductive pads 202 disposed in the insulating layer 201. Moreover, each through-via 210a in the semiconductor wafer 200 is formed in each opening 211 and conformally extends to the sidewalls and bottom of the opening 211 to be electrically connected to the conductive pad 202. Similarly, redistribution layers 210b have a fan-out structure and are formed on the surface 200a of semiconductor chip 200. In some embodiments, the redistribution layers 210b and the through-vias 210a are made of the same material layer. For example, each redistribution layer conformally extends over the sidewalls and bottom of each opening 211. Thereof, the portion of the redistribution layer formed in the opening 211 is also referred to as the through-via.

Referring to FIG. 5C, an encapsulating layer 110 and openings 113 are formed according to the method illustrated in FIG. 1C. The openings 113 expose the redistribution layers 210b in the corresponding semiconductor chip 200. According to the method illustrated in FIG. 1C, redistribution layers 112b are formed on the encapsulating layer 110 in each chip region D, and through-vias 112c are formed in the openings 113 in each chip region D, after forming the openings 113. The through-vias 112c are electrically connected to the redistribution layers 210b. In some embodiments, the redistribution layers 112b and the through-vias 112c are formed by depositing and patterning the same conformal metal layer.

Figure 5D:
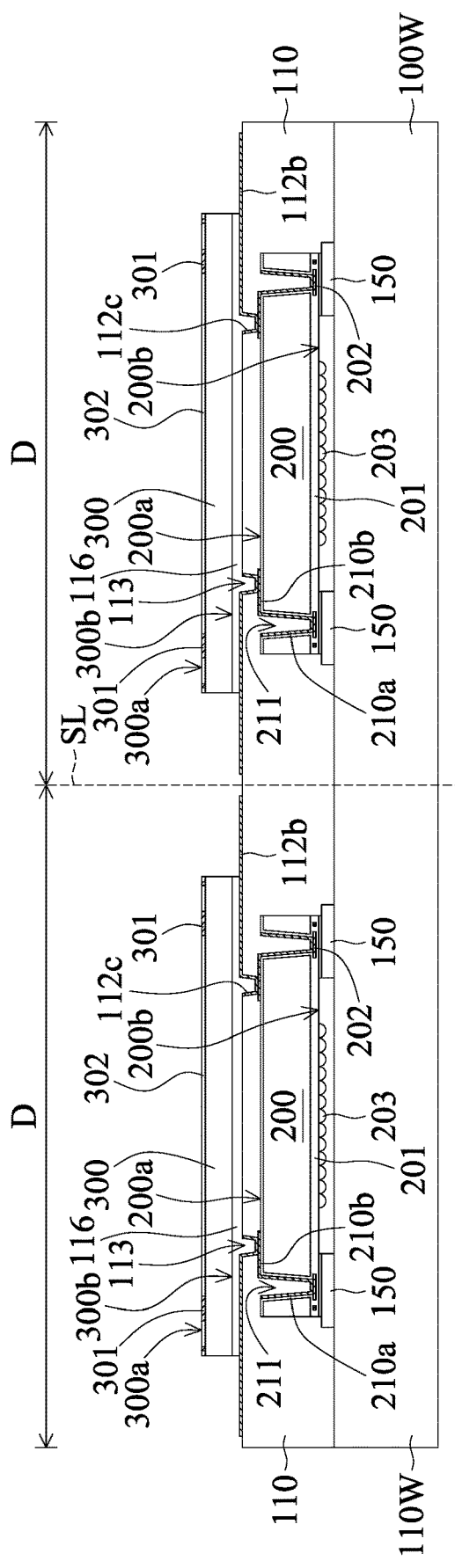

Referring to FIG. 5D, according to the method illustrated in FIG. 1D, the semiconductor chip 300 is stacked on the semiconductor chip 200 in the corresponding chip region D via the adhesive layer 116. For example, the adhesive layer 116 is attached to the non-active surface (e.g., surface 300b) of the corresponding semiconductor chip 300. The adhesive layer 116 is then in direct contact with the portion of the encapsulating layer 110 extending over the surface 200a of the semiconductor chip 200 and fills in the openings 113 (indicated in FIG. 5C), so that the semiconductor chip 300 is stacked on the corresponding semiconductor chip 200.

Figure 5E:
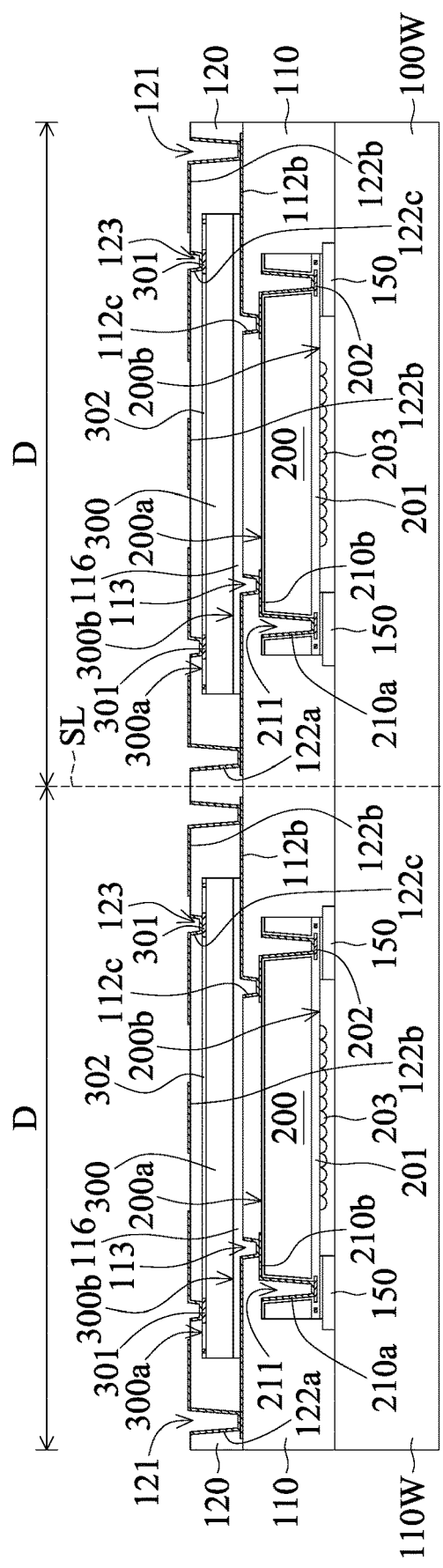

Referring to FIG. 5E, the encapsulating layer 120 and the openings 121 and 123 in the encapsulating layer 120 are formed according to the method illustrated in FIG. 1E. The openings 121 expose the redistribution layers 112b and the openings 123 expose the conductive pads 301 of the corresponding semiconductor chip 300. Moreover, according to the method illustrated in FIG. 1E, redistribution layers 122b are formed on the encapsulating layer 120 in each chip region D, and through-vias 122a and 122c are respectively formed in the openings 121 and 123 in each chip region D.

Figure 5F:
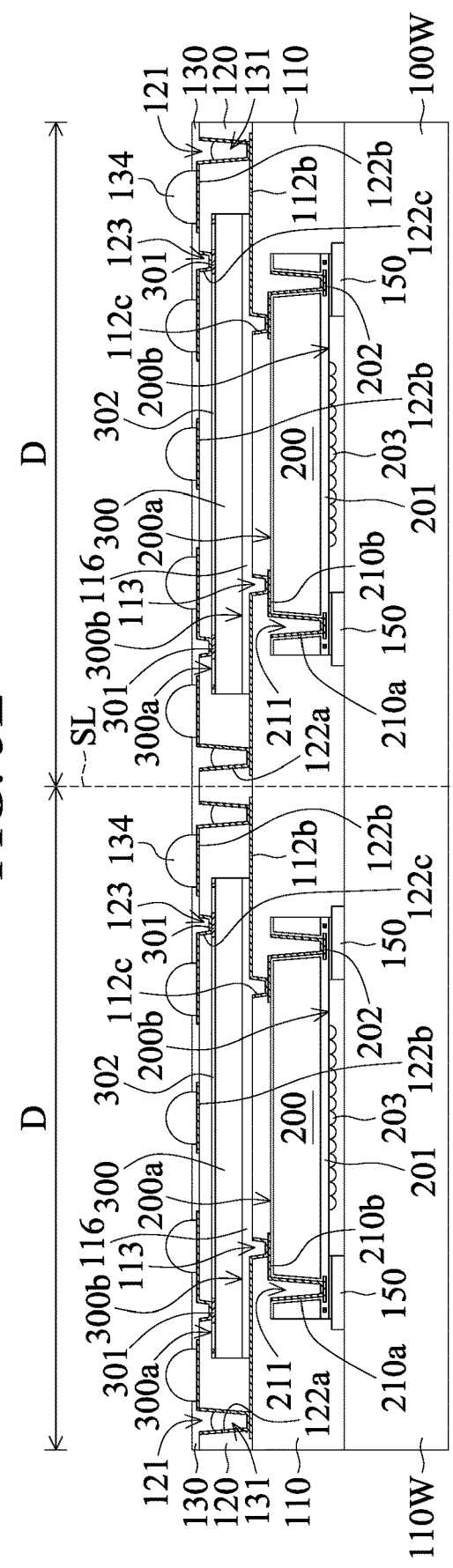

Referring to FIG. 5F, according to the method illustrated in FIG. 1F, a passivation layer 130 is formed on the encapsulating layer 120, a hole 131 is formed in each opening 121, and conductive structures 134 are formed in the passivation layer 130. Next, according to the method illustrated in FIG. 1F, the encapsulating layer 120, the encapsulating layer 110, and the substrate 100W are successively diced along the scribe-line region SL to form an individual chip package 20, as shown in FIG. 6.

Figure 8:
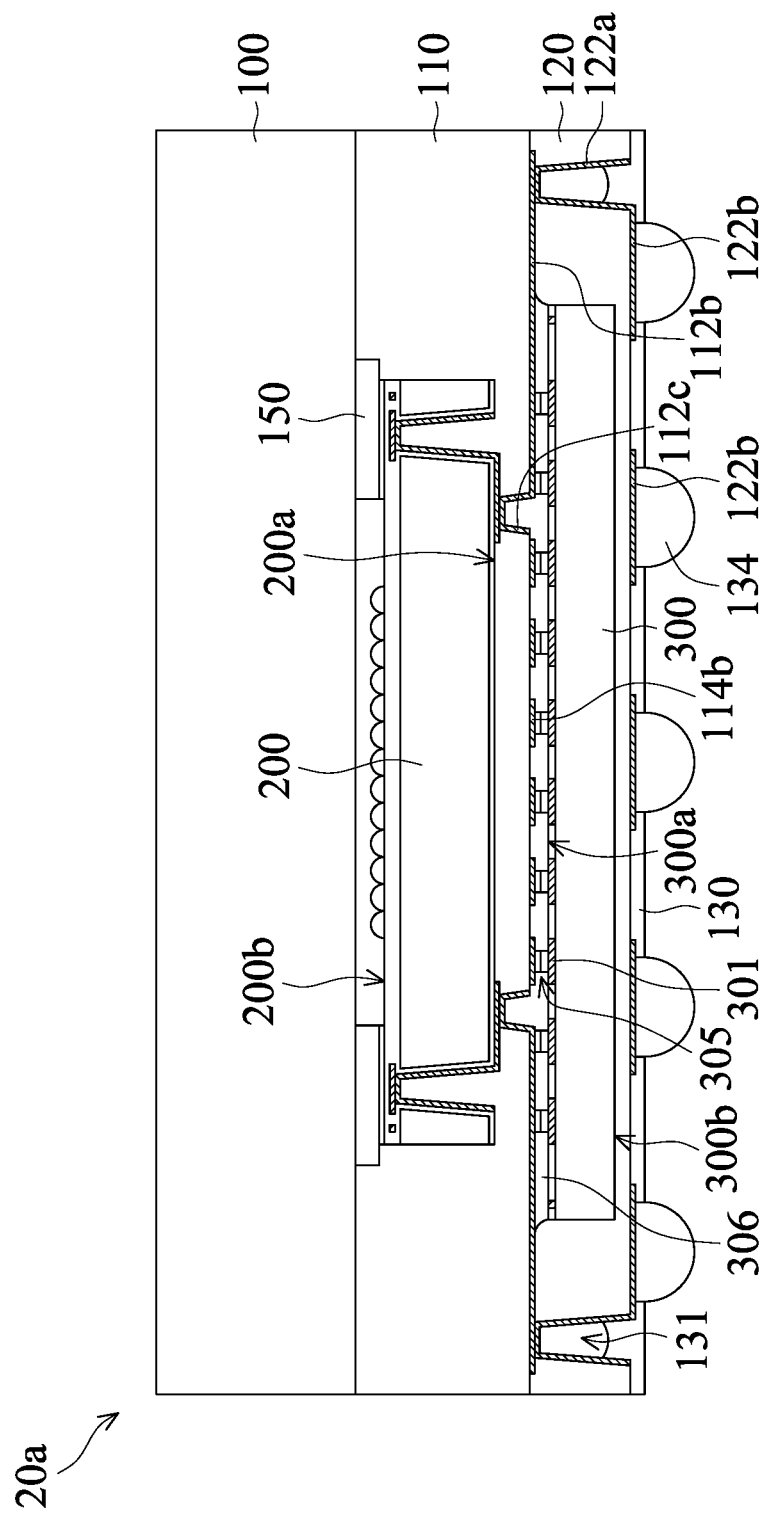
FIG. 8 is a cross-sectional view of a chip package in accordance with some embodiments of the present disclosure.

Referring to FIG. 8, which illustrates a cross-sectional view of a chip package 20a in accordance with some embodiments of the present disclosure. Elements in FIG. 8 that are the same as those in FIGS. 4 and 6 are labeled with the same reference numbers as in FIGS. 4 and 6 and are not described again for brevity. In some embodiments, the structure of chip package 20a is similar to the structure of chip package 20 in FIG. 6. The difference is that the active surface (e.g., surface 300a) of semiconductor chip 300 in chip package 20a faces the non-active surface (e.g., surface 200a) of semiconductor chip 200. In those cases, the chip package 20a further includes one or more conductive structures 305 disposed on the active surface of semiconductor chip 300 and electrically connected to the through-vias 112b. Moreover, the chip package 20a further includes an underfill layer 306 disposed between the encapsulating layer 110 and the semiconductor chip 300. The underfill layer 306 surrounds the conductive structures 305 and is surrounded by the encapsulating layer 120. In addition, since the active surface of the semiconductor chip 300 is opposite to the conductive structure 305, the chip package 20a does not have the through-vias 122c as those in the chip package 20.

Figure 7C:
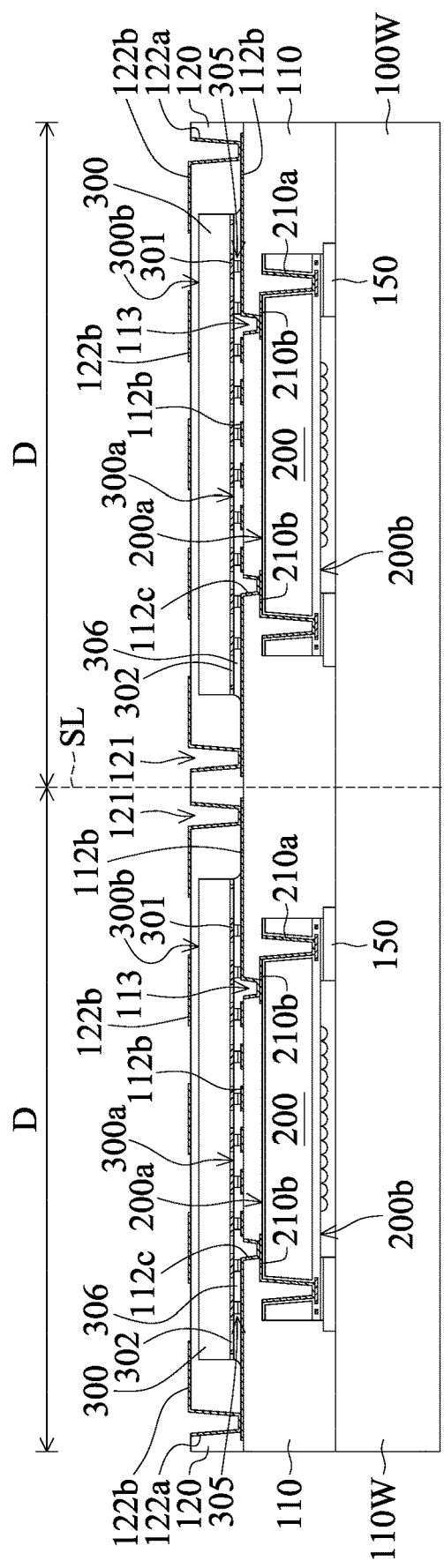

FIGS. 7A to 7D are cross-sectional view of a method for forming a chip package 20a in accordance with some embodiments of the present disclosure. Elements in FIGS. 7A to 7D that are the same as those in FIGS. 5A to 5F and 6 are labeled with the same reference numbers as in FIGS. 5A to 5F and 6 and are not described again for brevity. Referring to FIG. 7A, the structure as shown in FIG. 5B is provided. Next, an encapsulating layer 110 is formed on the substrate 100W and covers the surface 200a and sidewalls of the semiconductor chip 200 in each chip region D. Afterwards, openings 113 are formed to penetrate through the portion of the encapsulating layer 110 extending over the surface 200a of the semiconductor chip 200 by an etching process or a laser drilling process, to expose the redistribution layers 210b in each chip region D. In some embodiments, after the openings 113 are formed, redistribution layers 112b are formed on the encapsulating layer 110 in each chip region D, and through-vias 112c are formed in the openings 113 in each chip region D. The through-vias 112c are electrically connected to the redistribution layers 210b. In some embodiments, the redistribution layers 112b and the through-vias 112c are formed by depositing and patterning the same conformal metal layer. In other some embodiments, the pattern of redistribution layers 112b are the same as the pattern of redistribution layers 112b in chip package 20. It is understood that the design of the pattern of the redistribution layers 112b in chip package 20a depends on the arrangement of the conductive structures 305 and is not limited to the embodiment shown in FIG. 7A.

Referring to FIG. 7B, the semiconductor chip 300 is stacked on the semiconductor chip 200 in the corresponding chip region D by an underfill layer 306 and the conductive structure 305 formed on each of the conductive pads 301. For example, the conductive structures 305 are electrically connected to the corresponding redistribution layers 112b, and the underfill layer 306 is in direct contact with the portion of the encapsulating layer 110 extending over the surface 200a of the semiconductor chip 200, so that the semiconductor chip 300 is stacked on the corresponding semiconductor chip 200. As a result, the active surface (e.g., surface 300a) of semiconductor chip 300 faces the non-active surface (e.g., surface 200a) of semiconductor chip 200, and the conductive structures 305 are electrically connected between the semiconductor chip 300 and the redistribution layers 112b.

Referring to FIG. 7C, the encapsulating layer 120 and the openings 121 in the encapsulating layer 120, the redistribution layers 122b on the encapsulating layer 120, and the through-vias 122a in the openings 121 are formed according to the method illustrated in FIG. 5E.

Figure 7D:
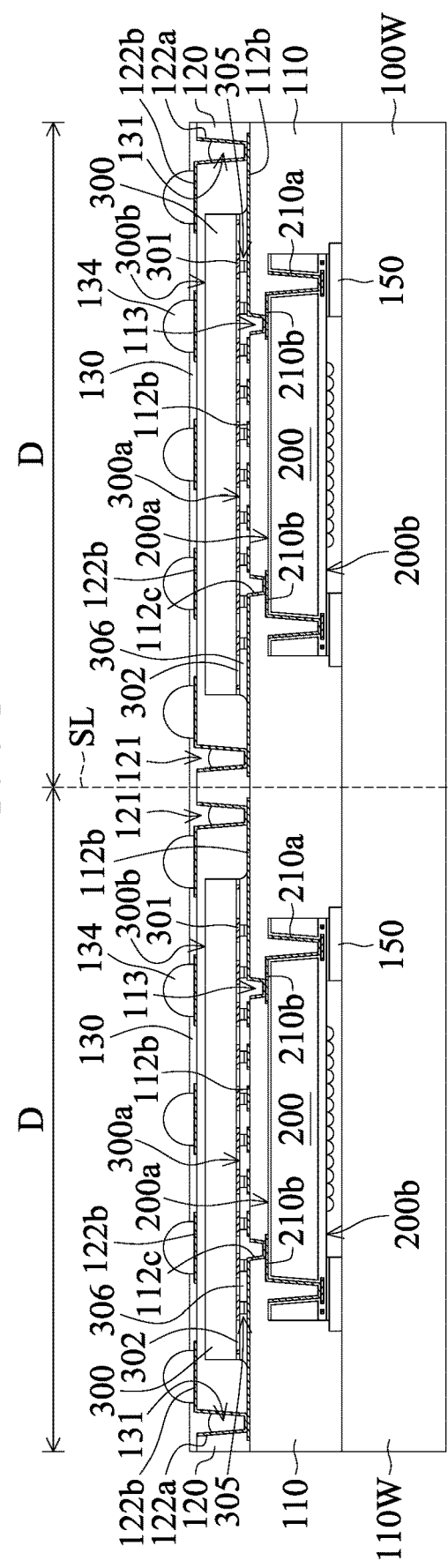

Referring to FIG. 7D, a passivation layer 130 is formed on the encapsulating layer 120 and in the openings 121, a conductive structure 134 is formed in each opening of the passivation layer 130 and electrically connected to the exposed redistribution layer 122b, and the encapsulating layer 120, the encapsulating layer 110 and substrate 100W are successively diced according to the method illustrated in FIG. 5F. After performing the dicing process, an individual chip package 20a is formed, as shown in FIG. 8.

Figure 10:
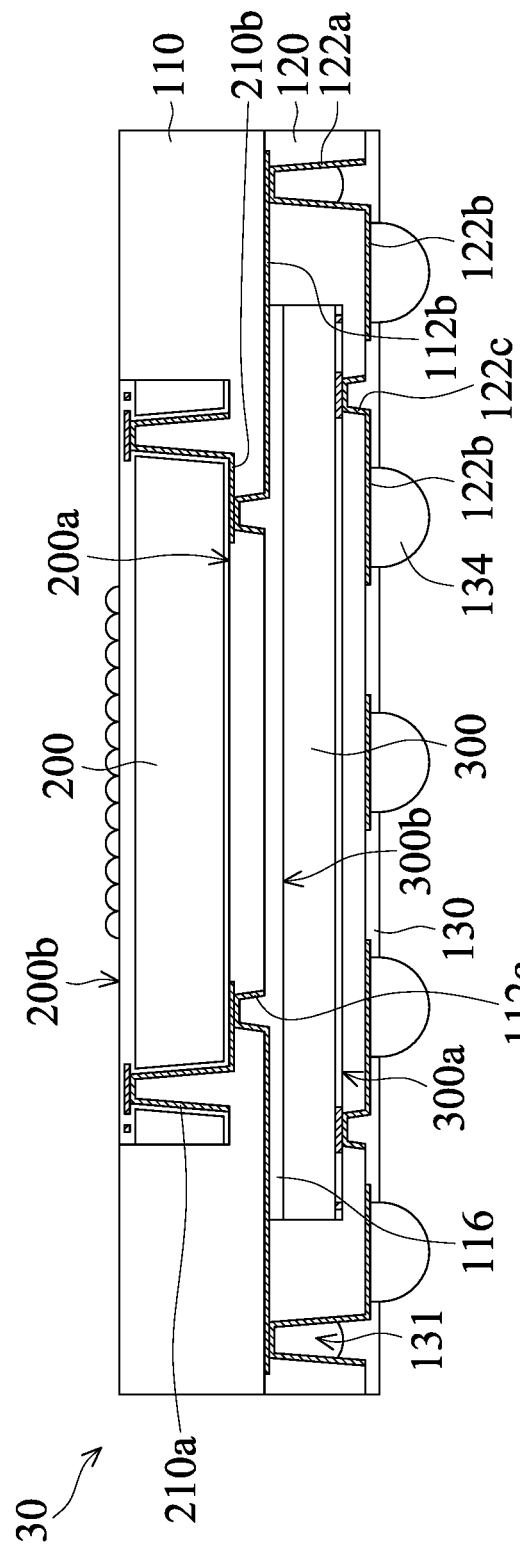
FIG. 10 is a cross-sectional view of a chip package in accordance with some embodiments of the present disclosure.

Referring to FIG. 10, which illustrates a cross-sectional view of the chip package 30 in accordance with some embodiments of the present disclosure. Elements in FIG. 10 that are the same as those in FIG. 6 are labeled with the same reference numbers as in FIG. 6 and are not described again for brevity. In some embodiments, the structure of the chip package 30 is similar to the structure of the chip package 20 in FIG. 6. The difference is that the chip package 30 does not have a cover plate 100 disposed above the semiconductor chip 200. Unlike the chip package 20, the active surface (e.g., surface 200b) of semiconductor chip 200 in chip package 30 is exposed to the external environment.

Figure 9A:
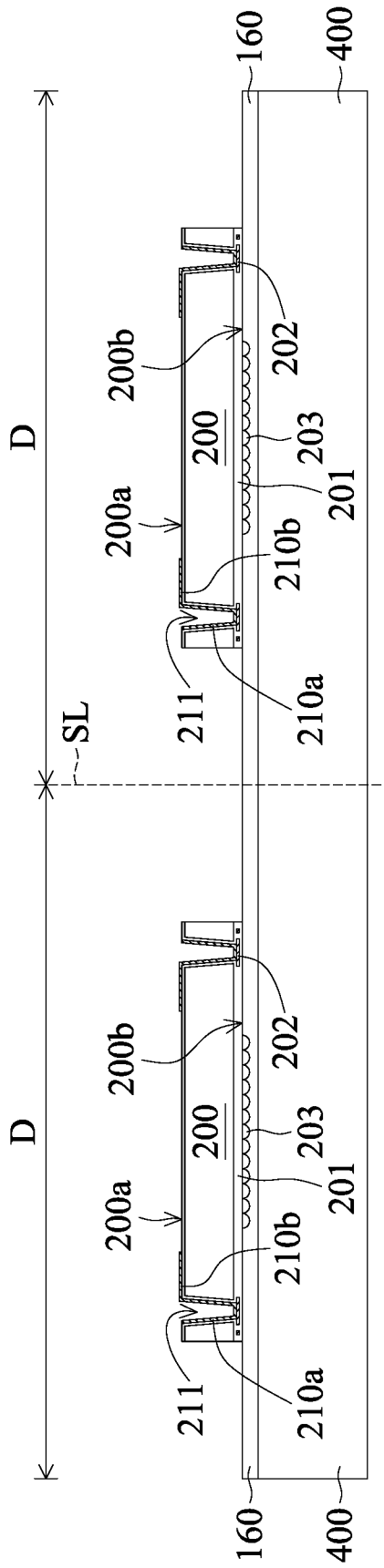
FIGS. 9A to 9E are cross-sectional views of a method for forming a chip package in accordance with some embodiments of the present disclosure.

FIGS. 9A to 9E are cross-sectional view of a method for forming a chip package 30 in accordance with some embodiments of the present disclosure. Elements in FIGS. 9A to 9E that are the same as those in FIGS. 5A to 5F and 6 are labeled with the same reference numbers as in FIGS. 5A to 5F and 6 and are not described again for brevity. Referring to FIG. 9A, a carrier substrate 400 is provided. The carrier substrate 400 has chip regions and a scribe-line region surrounding these chip regions and separating adjacent chip regions. To simplify the diagram, only two complete chip regions D and a scribe-line region SL separating these chip regions D are depicted herein. In some embodiments, the carrier substrate 400 is made of silicon, glass, ceramic, or another suitable substrate material, and has a wafer shape to facilitate a wafer-level package process. For example, the carrier substrate 400 is a glass wafer and serves as a temporary support structure in the manufacture of the chip package 30. Next, an adhesive layer 160 is formed on the carrier substrate 400. In some embodiments, the adhesive layer 160 is made of a light-to-heat conversion (LTHC) material or another suitable material. Afterwards, a semiconductor chip 200 as shown in FIG. 5B is provided. The semiconductor chip 200 is bonded to the carrier substrate 400 in the corresponding chip region D by the adhesive layer 160.

Figure 9B:
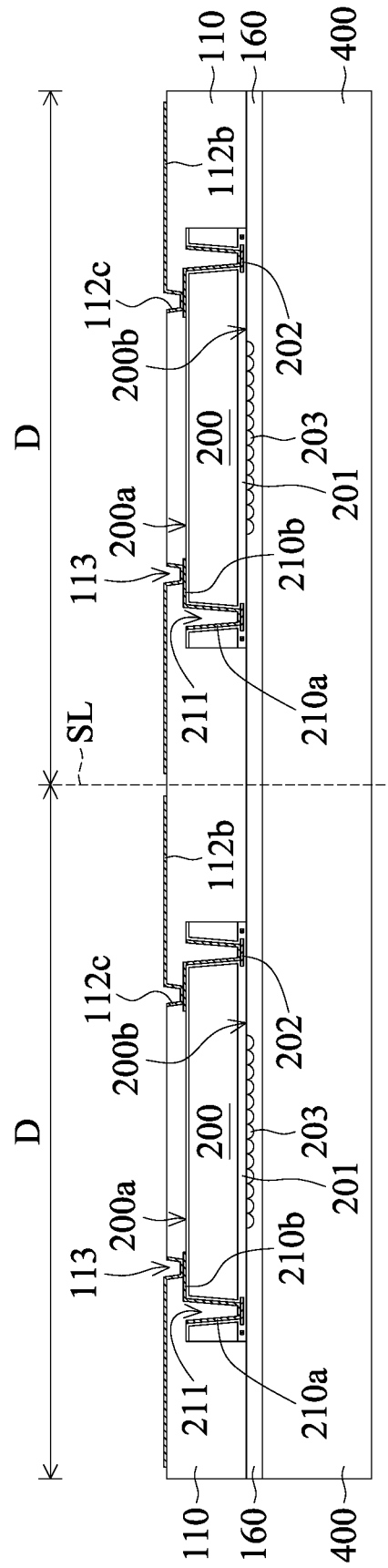

Referring to FIG. 9B, an encapsulating layer 110 and openings 113 are formed according to the method illustrated in FIG. 5C. The openings 113 expose the redistribution layers 210b on the corresponding semiconductor chip 200. According to the method illustrated in FIG. 5C, redistribution layers 112b are formed on the encapsulating layer 110 in each chip region D, and through-vias 112c are formed in the openings 113 in each chip region D. The through-vias 112c are electrically connected to the redistribution layers 210b.

Figure 9C:
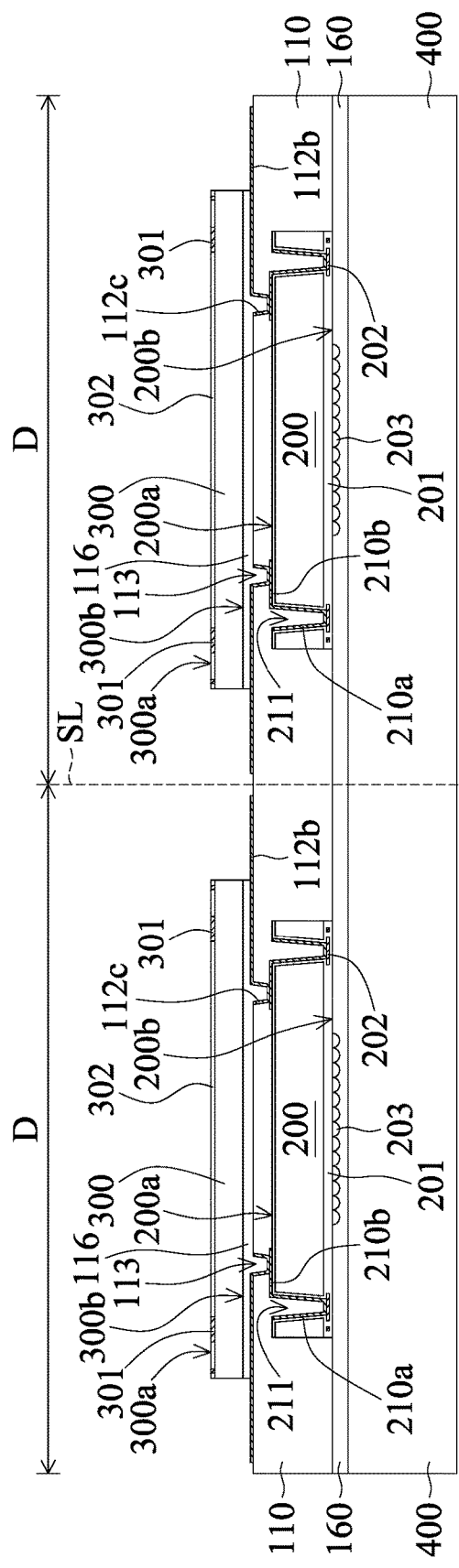

Referring to FIG. 9C, a semiconductor chip 300 is stacked on a semiconductor chip 200 in the corresponding chip region D via an adhesive layer 116 according to the method illustrated in FIG. 5D. For example, the adhesive layer 116 is attached onto the non-active surface (e.g., surface 300b) of the corresponding semiconductor chip 300, and then is in direct contact with the portion of the encapsulating layer 110 extending over the surface 200a of the semiconductor chip 200 and fills in the openings 113 (indicated in FIG. 9C), so that the semiconductor chip 300 is stacked on the corresponding semiconductor chip 200.

Figure 9D:
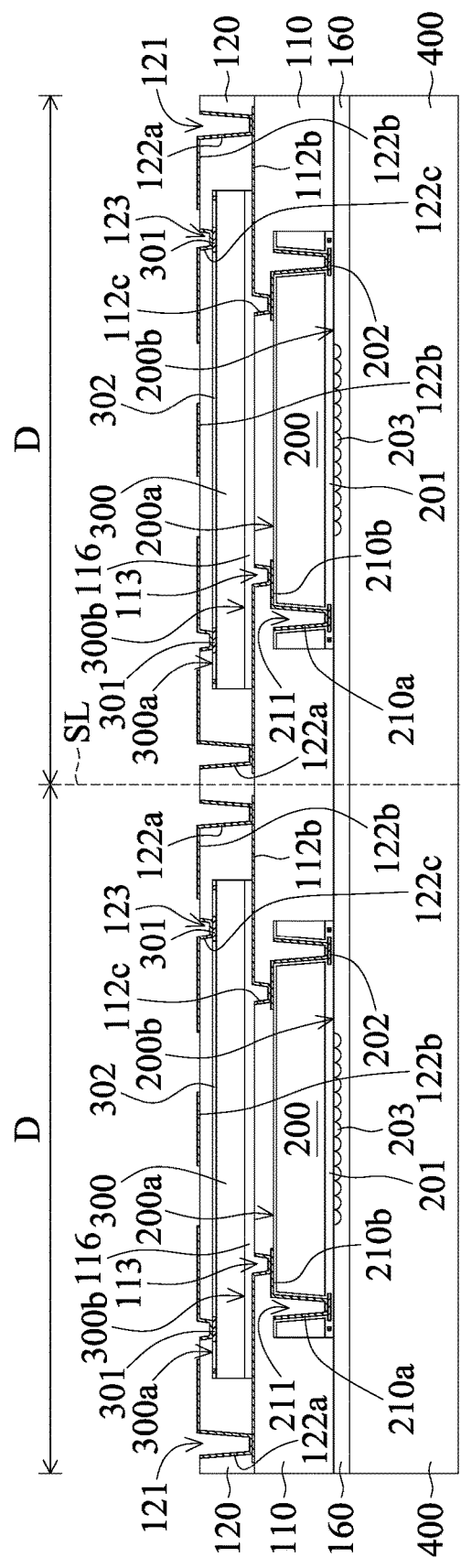

Referring to FIG. 9D, an encapsulating layer 120 and openings 121 and 123 in the encapsulating layer 120 are formed according to the method illustrated in FIG. 5E. The openings 121 expose the redistribution layers 112b and the openings 123 expose the corresponding conductive pads 301 of the semiconductor chip 300. Afterwards, according to the method illustrated in FIG. 5E, redistribution layers 122b are formed on the encapsulating layer 120 in each chip region D and through-vias 122a and 122c are respectively formed in openings 121 and 123 in each chip region D.

Figure 9E:
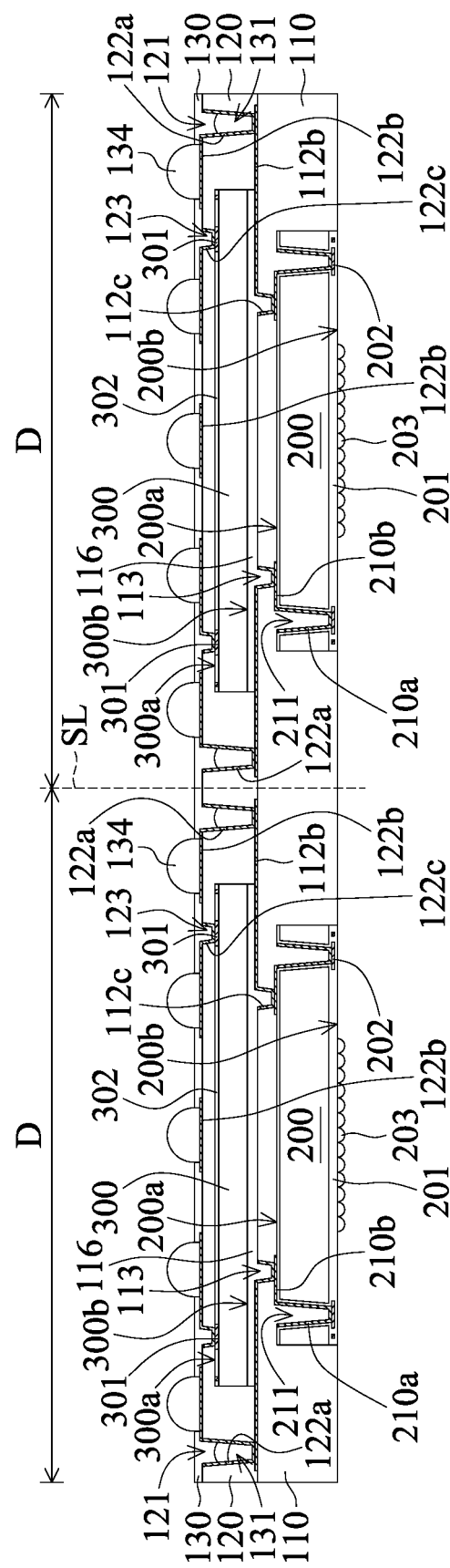

Referring to FIG. 9E, a passivation layer 130 is formed on the encapsulating layer 120, a hole 131 is formed in each opening 121, and conductive structures 134 are formed in the passivation layer 130 according to the method illustrated in FIG. 5F. Afterwards, the semiconductor chips 200 and 300 surrounded by the encapsulating layers 110 and 120 are de-bonded from the carrier substrate 400. In some embodiments, when the adhesive layer 160 is made of an LTHC material, the de-bonding process is performed by irradiating the adhesive layer 160 with laser light or UV light. Due to the heat generated by the laser or UV light, the LTHC material decomposes, and therefore the carrier substrate 400 is removed from the structure including the semiconductor chip 200 and 300. Next, according to the method illustrated in FIG. 5F, the encapsulating layer 120 and the encapsulating layer 110 are successively diced along the scribe-line region SL to form an individual chip package 30, as shown in FIG. 10.

Figure 12:
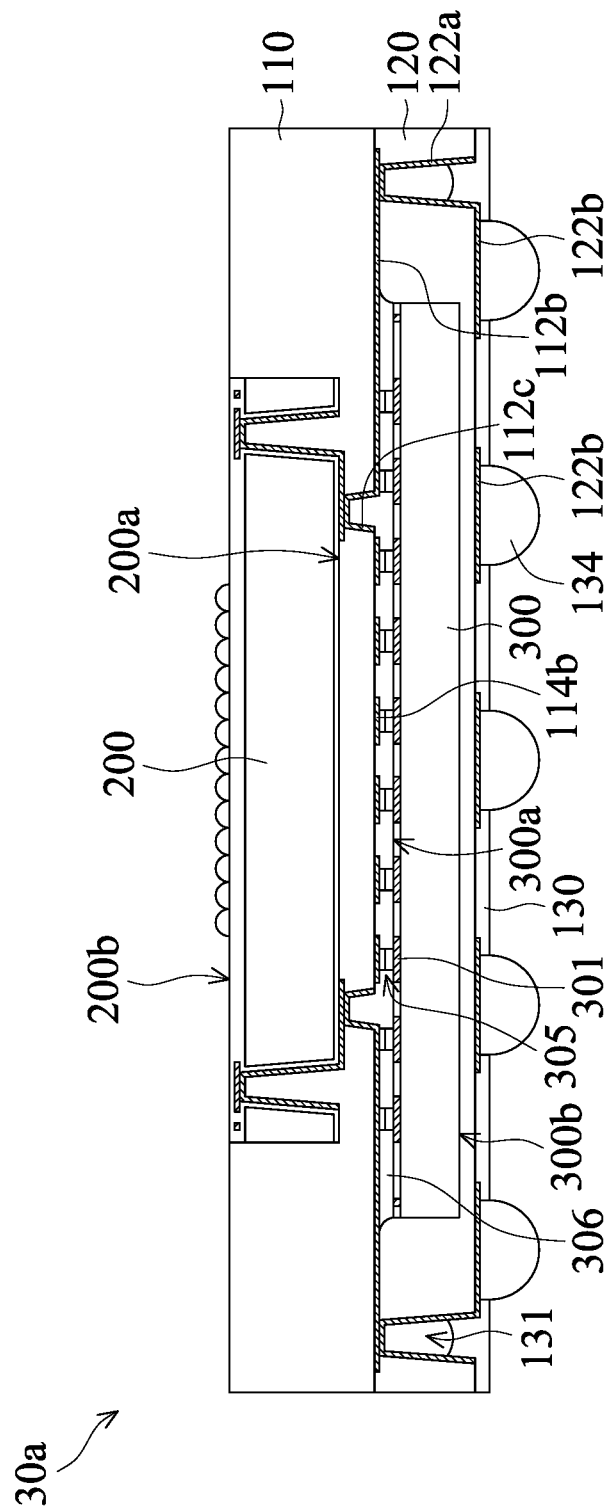
FIG. 12 is a cross-sectional view of a chip package in accordance with some embodiments of the present disclosure.

Referring to FIG. 12, which illustrates a cross-sectional view of the chip package 30a in accordance with some embodiments of the present disclosure. Elements in FIG. 12 that are the same as those in FIG. 8 are labeled with the same reference numbers as in FIG. 8 and are not described again for brevity. In some embodiments, the structure of chip package 30a is similar to the structure of chip package 20a in FIG. 8. The difference is that the chip package 30a does not have a cover plate 100 disposed above the semiconductor chip 200. Unlike the chip package 20a, the active surface (e.g., surface 200b) of semiconductor chip 200 in chip package 30a is exposed to the external environment.

FIGS. 11A to 11D are cross-sectional view of a method for forming a chip package 30a in accordance with some embodiments of the present disclosure. Elements in FIGS. 11A to 11D that are the same as those in FIGS. 7A to 7D and 8 are labeled with the same reference numbers as in FIGS. 7A to 7D and 8 and are not described again for brevity. Referring to FIG. 11A, a carrier substrate 400 as shown in FIG. 9A is provided. The carrier substrate 400 has an adhesive layer 160 formed thereon. In some embodiments, the adhesive layer 160 is made of an LTHC material or another suitable material. Afterwards, a semiconductor chip 200 as shown in FIG. 7A is provided, and the semiconductor chip 200 is bonded to the carrier substrate 400 in the corresponding chip region D by the adhesive layer 160. An encapsulating layer 110 and openings 113 are formed according to the method illustrated in FIG. 7A. The openings 113 expose the redistribution layers 210b on the corresponding semiconductor chip 200. Afterwards, according to the method illustrated in FIG. 7A, redistribution layers 112b are formed on the encapsulating layer 110 in each chip region D, and through-vias 112c are formed in the openings 113 in each chip region D. The through-vias 112c are electrically connected to the redistribution layers 210b.

Referring to FIG. 11B, a semiconductor chip 300 is stacked on a semiconductor chip 200 in the corresponding chip region D by an underfill layer 306 and a conductive structure 305 formed on each conductive pad 301, as described in the method of FIG. 7B.

Referring to FIG. 11C, an encapsulating layer 120 and openings 121 in the encapsulating layer 120, the redistribution layers 122b on the encapsulating layer 120, and the through-vias 122b in the openings 121 are formed according to the method illustrated in FIG. 7C.

Referring to FIG. 11D, according to the method illustrated in FIG. 7D, a passivation layer 130 is formed on the encapsulating layer 120 and in the opening 121, and a conductive structure 134 is formed in each opening in the passivation layer 130 and electrically connected to the exposed redistribution layer 122b. Afterwards, the semiconductor chips 200 and 300 surrounded by encapsulating layers 110 and 120 are de-bonded from the carrier substrate 400. In some embodiments, when the adhesive layer 160 is made of an LTHC material, the de-bonding process is performed by irradiating the adhesive layer 160 with laser light or UV light to remove the carrier substrate 400 from the structure including the semiconductor chips 200 and 300. Next, according to the method illustrated in FIG. 7D, the encapsulating layer 120 and the encapsulating layer 110 are successively diced along the scribe-line region SL. After the dicing process, an individual chip package 30a is formed, as shown in FIG. 12.

According to the foregoing embodiments, since a portion of the encapsulating layer is employed to separate the top semiconductor chip from the bottom semiconductor chip, the distance between two such semiconductor chips can be increased, thereby reducing the parasitic capacitance between the semiconductor chips. Similarly, since a portion of the encapsulating layer is employed to separate the bottom semiconductor chip from the external conductive structures of the chip package (e.g., solder balls, bumps, or conductive posts), the distance between the semiconductor chip and the external conductive structures can be increased, thereby improving the electrical isolation between the semiconductor chip and the external conductive structures to reduce the leakage current of the chip package. As a result, the reliability of the chip package can be increased.

According to the foregoing embodiments, the semiconductor chips in the chip package with the heterogeneous integrated structure are arranged in a vertical stacking manner. Therefore, such a chip package can effectively reduce the form factor of the package as compared to the case where the semiconductor chips in the chip package are arranged in a side-by-side manner.

According to the foregoing embodiments, the through-vias formed in the encapsulating layer are employed to be electrically connected to the vertically stacked semiconductor chips in the chip package. Therefore, such a chip package can effectively reduce the manufacturing cost compared to the case where through-vias (e.g., through substrate vias or through silicon vias) formed in the semiconductor chip are employed to be electrically connected to the vertically stacked semiconductor chips.

While the invention has been disclosed in terms of the preferred embodiments, it is not limited. The various embodiments may be modified and combined by those skilled in the art without departing from the concept and scope of the invention.

What is claimed is:

1. A chip package, comprising:
   a first semiconductor chip having a first surface and a second surface opposite the first surface;
   a second semiconductor chip stacked on the second surface and having a third surface facing the second surface and a fourth surface opposite the third surface;
   a first encapsulating layer surrounding the first semiconductor chip;
   a second encapsulating layer surrounding the second semiconductor chip;
   a first through-via penetrating through the first encapsulating layer; and
   a second through-via, penetrating through the second encapsulating layer and electrically connected between the second semiconductor chip and the first through-via,
   wherein the first surface is an active surface of the first semiconductor chip and the fourth surface is an active surface of the second semiconductor chip.

2. The chip package as claimed in claim 1, wherein an area of the second surface of the first semiconductor chip is larger than an area of the third surface of the second semiconductor chip.

3. The chip package as claimed in claim 2, wherein the first semiconductor chip is an artificial intelligence chip.

4. The chip package as claimed in claim 2, wherein the second semiconductor chip is an image-sensing chip.

5. The chip package as claimed in claim 1, further comprising:
   a transparent cover plate disposed above the semiconductor chip and covering the second encapsulating layer.

6. The chip package as claimed in claim 1, wherein the second surface is a non-active surface of the first semiconductor chip, wherein a portion of the first encapsulating layer extends over the first surface, and wherein a portion of the second encapsulating layer extends between the second surface and the third surface.

7. The chip package as claimed in claim 6, further comprising:
   a third through-via penetrating through the portion of the first encapsulating layer and electrically connected between the first semiconductor chip and the first through-via; and
   an adhesive layer in direct contact with the portion of the second encapsulating layer and the non-active surface of the first semiconductor chip.

8. The chip package as claimed in claim 1, wherein the second surface is an active surface of the first semiconductor chip, wherein a portion of the first encapsulating layer extends over the first surface, and wherein a portion of the second encapsulating layer extends between the second surface and the third surface.

9. The chip package as claimed in claim 8, further comprising:
   a plurality of conductive structures disposed on the active surface of the first semiconductor chip and electrically connected to the second through-via.

10. The chip package as claimed in claim 1, further comprising:
    a first redistribution layer disposed beneath the first encapsulating layer and electrically connected to the first through-via;
    a second redistribution layer disposed between the first encapsulating layer and the second encapsulating layer, and electrically connected between the first through-via and the second through-via;
    a third redistribution layer disposed on the second encapsulating layer and electrically connected to the second through-via; and
    a plurality of conductive structures disposed below the first encapsulation layer and the first semiconductor chip, and electrically connected to the first redistribution layer.

11. A chip package, comprising:
    a first semiconductor chip having a first surface and a second surface opposite the first surface;
    a second semiconductor chip stacked on the second surface and having a third surface facing the second surface and a fourth surface opposite the third surface;
    a first encapsulating layer surrounding the first semiconductor chip, wherein a portion of the first encapsulating layer extends over the first surface;
    a second encapsulating layer surrounding the second semiconductor chip, wherein a portion of the second encapsulating layer extends between the second surface and the third surface;
    a first through-via penetrating through the first encapsulating layer;
    a second through-via penetrating through the second semiconductor chip; and
    a third through-via penetrating through the portion of the second encapsulating layer, and electrically connected between the first through-via and the second through-via.

12. The chip package as claimed in claim 11, wherein an area of the second surface of the first semiconductor chip is greater than an area of the third surface of the second semiconductor chip.

13. The chip package as claimed in claim 12, wherein the first semiconductor chip is an artificial intelligence chip.

14. The chip package as claimed in claim 12, wherein the second semiconductor chip is an image-sensing chip.

15. The chip package as claimed in claim 11, further comprising:
a transparent cover plate disposed above the semiconductor chip and covering the second encapsulating layer.

16. The chip package as claimed in claim 11, wherein the second surface is a non-active surface of the first semiconductor chip.

17. The chip package as claimed in claim 16, further comprising:
a fourth through-via penetrating through the portion of the first encapsulating layer and electrically connected between the first semiconductor chip and the first through-via; and
an adhesive layer in direct contact with the second encapsulating layer and the non-active surface of the first semiconductor chip.

18. The chip package as claimed in claim 11, wherein the second surface is an active surface of the first semiconductor chip.

19. The chip package as claimed in claim 16, further comprising:
a plurality of conductive structures disposed on the active surface of the first semiconductor chip and electrically connected to the third through-via.

20. The chip package as claimed in claim 11, further comprising:
a first redistribution layer formed below the first encapsulating layer, and electrically connected to the first through-via;
a second redistribution layer formed between the first encapsulating layer and the second encapsulating layer, and electrically connected between the first through-via and the third through-via;
a third redistribution layer formed on the third surface and electrically connected between the second through-via and the third through-via; and
a plurality of conductive structures disposed below the first encapsulating layer and the first semiconductor chip, and electrically connected to the first redistribution layer.

* * * * *